United States Patent
Djahanshahi et al.

(10) Patent No.: US 10,389,301 B2
(45) Date of Patent: Aug. 20, 2019

(54) METHOD AND APPARATUS FOR RECONFIGURABLE MULTICORE OSCILLATOR

(71) Applicant: MICROSEMI SOLUTIONS (U.S.), INC.

(72) Inventors: Hormoz Djahanshahi, Port Moody (CA); Srinivasa Rao Madala, Chimakurthy (IN)

(73) Assignee: MICROSEMI SOLUTIONS (U.S.), INC., Aliso Viejo, CA (US)

( * ) Notice: Subject to any disclaimer, the term of this patent is extended or adjusted under 35 U.S.C. 154(b) by 205 days.

(21) Appl. No.: 15/718,460

(22) Filed: Sep. 28, 2017

(65) Prior Publication Data

US 2018/0097475 A1    Apr. 5, 2018

Related U.S. Application Data

(60) Provisional application No. 62/403,939, filed on Oct. 4, 2016.

(51) Int. Cl.
| | |
|---|---|
| *H03B 1/04* | (2006.01) |
| *H03B 5/12* | (2006.01) |
| *H03B 27/00* | (2006.01) |

(52) U.S. Cl.
CPC .......... *H03B 1/04* (2013.01); *H03B 5/12* (2013.01); *H03B 5/1215* (2013.01); *H03B 27/00* (2013.01);
(Continued)

(58) Field of Classification Search
CPC .......... H03B 1/04; H03B 5/12; H03B 5/1215; H03B 27/00; H03B 2200/0076; H03B 2200/04; H03B 2200/009
See application file for complete search history.

(56) References Cited

U.S. PATENT DOCUMENTS

| | | |
|---|---|---|
| 6,960,963 B2 | 11/2005 | Kim |
| 7,295,076 B2 | 11/2007 | Kim et al. |

(Continued)

FOREIGN PATENT DOCUMENTS

EP    2769466 A1    8/2014

OTHER PUBLICATIONS

Deng et al., "A 4-Port-Inductor-Based VCO Coupling Method for Phase Noise Reduction," IEEE Journal of Solid-State Circuits, Aug. 2011, vol. 46 (8), pp. 1772-1781.

(Continued)

*Primary Examiner* — Jeffrey M Shin
(74) *Attorney, Agent, or Firm* — Leber IP Law; David C. Robertson

(57) ABSTRACT

The present disclosure relates to a reconfigurable multicore inductor capacitor (LC) oscillator comprising a plurality of oscillator cores. The oscillator may be configured at runtime, at manufacturing, or at production, which may allow for the tailoring of operating characteristics of the oscillator, such as phase noise, electromagnetic interference, or power consumption, for a specific application after production. The cores are coupled through an interconnect network to a common electrical signal output. A subset of the cores may be selectively enabled while the remainder of the cores is disabled. The ability to enable only a subset of the cores allows the total number of enabled cores to be reconfigurable. Furthermore, the direction in which oscillation current flows through the inductor of the cores may be configured. Reconfiguring the number of enabled cores and/or the oscillation current direction in the cores allow operating characteristics of the oscillator to be tailored after production.

25 Claims, 15 Drawing Sheets

(52) U.S. Cl.
CPC ............... *H03B 2200/009* (2013.01); *H03B 2200/0076* (2013.01); *H03B 2202/04* (2013.01)

(56) References Cited

U.S. PATENT DOCUMENTS

| | | |
|---|---|---|
| 7,952,439 B1 | 5/2011 | Heggemeier et al. |
| 8,368,478 B2 | 2/2013 | McDonald |
| 8,390,385 B2 | 3/2013 | Kondo |
| 8,410,858 B2 | 4/2013 | Wood |
| 9,184,498 B2 | 11/2015 | Schiller |
| 2010/0245100 A1* | 9/2010 | Wang .................. G01R 29/26 340/635 |
| 2013/0099870 A1 | 4/2013 | Terrovitis |
| 2015/0288393 A1 | 10/2015 | Han et al. |
| 2018/0097475 A1* | 4/2018 | Djahanshahi ........ H03B 5/1215 |

OTHER PUBLICATIONS

Shirinfar et al., "A Multichannel, Multicore mm-Wave Clustered VCO with Phase Noise, Tuning Range, and Lifetim: Reliability Enhancements," Radio Frequency Integrated Circuits Symposium (RFIC), 2013 IEEE, Jun. 2-4, 2013, pp. 235-238.

\* cited by examiner

METHOD AND APPARATUS FOR RECONFIGURABLE MULTICORE OSCILLATOR

CROSS REFERENCE TO RELATED APPLICATIONS

This application claims the benefit of priority of U.S. Provisional Patent Application No. 62/403,939, filed on Oct. 4, 2016 which is hereby incorporated by reference.

FIELD

The present disclosure relates to oscillators, and more particularly to oscillators having multiple oscillator cores.

BACKGROUND

In many radio frequency (RF) applications, the phase noise of a local oscillator (LO) clock source is a key concern in designing the system. In broadband applications such as telecommunication, phase noise is often expressed in frequency domain in units of decibels relative to the carrier per Hertz (dBc/Hz), or equivalently in time domain using terms such as integrated root mean square (RMS) jitter or total jitter.

Voltage controlled oscillators (VCOs) are electronic oscillators used in a number of electronic circuits. A VCO has a voltage input that controls the oscillation frequency. An inductor-capacitor (LC) VCO is a VCO that includes a frequency-selective resonance tank including an inductor and a capacitor. In designing a low phase noise VCO, the size of a gain stage of the VCO (also known as driver) can be optimized in order to improve driver signal-to-noise ratio (SNR). In many cases, driver noise due to active or resistive components in gain stage dominates the phase noise. Some ways for attempting to lower phase noise are known to those skilled in the art.

The phase noise of a single VCO can be improved, meaning reduced, up to a certain point by improving the quality factor (Q) of the LC resonance tank, referred to subsequently herein as an LC tank. The Q factor can be improved but at some point the inductance and the Q factor become too challenging to model and predict, and other implementation limitations arise.

A greater reduction in phase noise may be achieved by implementing two or more resonance LC tanks in parallel. This approach is known as multicore VCO or array VCO. A multicore VCO is a VCO comprising a plurality of connected inductor capacitor (LC) VCOs, or "cores", and an averaging scheme for improving the collective phase noise of the VCO. The overall oscillator clock signal comprises an average of oscillation signals of the plurality of VCO cores. The multiple cores maybe arranged physically in an array, for example having one or more rows and columns.

The VCO cores, and thus their LC tanks, are connected in parallel. The oscillation phase noise improvement with a multicore VCO compared to a single core VCO is ideally $10*\log_{10}(N)$ decibels (dB), where N represents the number of cores coupled in-phase. For example, when N=2, a 3 dB improvement in phase noise may be achieved. The oscillation power of the multicore VCO increases by a factor of N whereas the random noise power of the VCO only increases by the square root of N.

FIG. 1 shows a multicore VCO 100 comprising multiple VCO cores 101, 102, 103, 104. The output of each core is connected to a coupling and averaging circuit 105. An example VCO core 101 comprises a driver 156, an inductor 150, a fixed capacitor 154, and a voltage-tunable variable capacitor, or varactor 152, the capacitance of which is determined by an input control voltage. The driver 156 has a transconductance gain '$g_m$' and provides sufficient gain to overcome the losses in the non-ideal inductance and capacitance elements and lossy interconnections to ensure that the criteria for generating oscillations are met. The inductor 150 and fixed capacitor 154 approximately set the natural resonant frequency of the VCO core. By tuning the control voltage of the varactor 152, the frequency of the VCO core can be fine-tuned. For example, a phase-locked loop (PLL) circuit can be constructed to lock the VCO's output signal frequency and phase to the frequency and phase of a system level input reference clock signal.

In the multicore VCO 100 in FIG. 1, the outputs of the VCO cores 101, 102, 103, 104 are connected to coupling and averaging circuit 105, which averages the individual outputs of the first to Nth VCO cores 101, 102, 103, 104. The signal output 140 of the coupling and averaging circuit 105 can be used as the overall oscillator output signal. Because the noise of each array element (VCO core) is uncorrelated from the others but the signals of the VCO elements in the array can be synchronized and correlated by means of coupling, the SNR of the average output signal of the array of VCO elements can be higher than the SNR of an individual VCO element's signal, hence the phase noise can be improved in the VCO array.

Conventionally, the desired characteristics (e.g. phase noise, electromagnetic interference (EMI), and/or power consumption characteristics) of a multicore VCO are selected at design time, and the VCO is designed, laid out and manufactured accordingly with no ability to vary the characteristics at a later time, other than the adjustment of the respective varactor 152 and/or capacitor 154. A considerable amount of time and effort for electromagnetic (EM) modeling and simulation may be required at the design stage. Characteristics include, for example, phase noise, EMI (e.g. near-field and/or far-field), power consumption, quality factor (Q), and frequency tuning range. One issue with a multicore VCO is that it can produce more EMI compared to a single core VCO as a result of there being multiple inductors, namely one or more inductors in each VCO core. Accordingly, in this regard there may be a tradeoff between phase noise and EMI of a multicore VCO.

Unfortunately, not all characteristics can be optimized in one design particularly as there are performance tradeoffs between characteristics. Furthermore, once a multicore VCO has been designed and manufactured, its performance and behavior may differ from those of the simulated design, for example due to manufacturing variations or inaccuracies introduced in modeling and simulations. However, existing multicore VCOs provide little or no flexibility for adjusting these tradeoffs depending on the specific circuit application in which the VCO is to be used or on the performance of the manufactured device.

SUMMARY

According to an aspect, the present disclosure is directed to a method for reconfiguring a multicore inductor-capacitor (LC) oscillator where selective configuring of the oscillator cores allows for adjustment of at least one of a collective phase noise characteristic at a common electrical signal output or a collective electromagnetic interference characteristic of the multicore oscillator, the method comprising: configuring the multicore LC oscillator comprising a plurality of oscillator cores arranged in an array and each having an LC resonance tank by: selectively enabling a subset of the plurality of oscillator cores by configuring selection circuitry to cause the subset of oscillator cores to be electrically coupled to the common electrical signal output of the multicore oscillator; selectively disabling a remainder of the oscillator cores by configuring the selection circuitry to cause the remainder of oscillator cores to be electrically decoupled from the common electrical signal output so that the subset is enabled and the remainder is disabled simultaneously, the remainder not in the subset and each of the subset and the remainder including at least one oscillator core; and selectively configuring the selection circuitry to configure each oscillator core of the enabled subset of oscillator cores with one of a first magnetic flux polarity and a second magnetic flux polarity opposite to the first magnetic flux polarity, where the enabling, disabling, and configuring the magnetic flux polarities of the plurality of cores is reconfigurable.

In an embodiment, the configuring of the multicore oscillator further comprises adjusting one or more of the plurality of oscillator cores so that the plurality of oscillator cores are substantially matched to each other in oscillation amplitude and resonance frequency.

In an embodiment, the configuring the selection circuitry comprises configuring the plurality of oscillator cores such that there are no disabled oscillator cores between any two enabled oscillator cores in the array.

In an embodiment, the configuring the selection circuitry comprises configuring the plurality of oscillator cores such that there is at least one disabled oscillator core between two enabled oscillator cores in the array.

In an embodiment, the method further comprises configuring the selection circuitry such that some of the enabled oscillator cores have the first magnetic flux polarity and the rest of the enabled oscillator cores have the second magnetic flux polarity for reducing the overall electromagnetic interference of the multicore oscillator.

In an embodiment, the configuring the selection circuitry comprises configuring analog switches for each enabled oscillator core to connect the oscillator core to the common electrical signal output in one of a first configuration where oscillation current flows through an inductor of its LC resonance tank in a first direction resulting in the first magnetic flux polarity, and a second configuration where oscillation current flows through the inductor of its LC resonance tank in a second direction opposite to the first direction resulting in the second magnetic flux polarity.

In an embodiment, the method further comprises configuring the selection circuitry such that all of the enabled oscillator cores have the same magnetic flux polarity for reducing the overall phase noise of the multicore oscillator at the common electrical signal output.

In an embodiment, the method further comprises receiving configuration parameters for configuring the multicore oscillator, and the selectively configuring the multicore oscillator being based on the received configuration parameters.

According to an aspect, the present disclosure is directed to a method for operating a multicore inductor-capacitor (LC) oscillator where generating oscillation signals at an enabled subset of cores allows for adjustment of at least one of a collective phase noise characteristic in an outputted combined oscillation signal or an overall power consumption of the multicore oscillator, the method comprising: operating the multicore LC oscillator comprising a plurality of oscillator cores arranged in an array and each having an LC resonance tank by: generating oscillation signals at an enabled subset of the plurality of oscillator cores, where each oscillator core of the enabled subset is configured to have one of a first magnetic flux polarity and a second magnetic flux polarity opposite to the first magnetic flux polarity, and where a remainder of the plurality of oscillator cores is disabled and powered down, the remainder not being in the enabled subset and each of the subset and the remainder including at least one oscillator core, and where the enabling and disabling of the plurality of cores is reconfigurable; and outputting a combined oscillation signal formed based on the oscillation signals generated at the enabled subset of oscillator cores.

In an embodiment, the method further comprises adjusting one or more of the plurality of oscillator cores so that the plurality of oscillator cores are substantially matched to each other in oscillation amplitude and resonance frequency.

In an embodiment, the method further comprises configuring the plurality of oscillator cores such that there are no disabled oscillator cores between any two enabled oscillator cores in the array.

In an embodiment, the method further comprises configuring the plurality of oscillator cores such that there is at least one disabled oscillator core between two enabled oscillator cores in the array.

In an embodiment, the number of disabled and powered down cores in the remainder is at least 50% of the plurality of cores of the oscillator.

According to an aspect, the present disclosure is directed to an apparatus providing for the selective reconfiguring of oscillator cores of a multicore oscillator to provide adjustment of at least one of a collective phase noise characteristic at a signal output circuitry or of a collective electromagnetic interference characteristic of the multicore oscillator, the apparatus comprising: a multicore inductor-capacitor (LC) oscillator having a plurality of oscillator cores arranged in an array and each having an LC resonance tank; signal output circuitry for electrically coupling outputs of the plurality of cores and for outputting a combined oscillation signal formed based on oscillation signals generated at a subset of the plurality of oscillator cores; and reconfigurable selection circuitry for selectively coupling the subset of the plurality of oscillator cores to the signal output circuitry for enabling the subset, and for selectively decoupling a remainder of the plurality of oscillator cores from the signal output circuitry for disabling the remainder, where the remainder is not in the subset and each of the subset and the remainder includes at least one oscillator core, the selection circuitry also for selectively configuring each oscillator core of the enabled subset of oscillator cores to have one of a first magnetic flux polarity and a second magnetic flux polarity opposite to the first magnetic flux polarity.

In an embodiment, the selection circuitry comprises a plurality of reconfigurable analog switches, where one or more of the analog switches of the plurality are electrically disposed between each oscillator core and the signal output circuitry for the selectively coupling or decoupling the oscillator core to the signal output circuitry and for the configuring the oscillator core with one of the first and second magnetic flux polarities.

In an embodiment, the apparatus further comprises a controller in communication with the selection circuitry, the controller configured to receive configuration information; and control the selection circuitry based on the configuration information for coupling or decoupling the oscillator cores to the signal output circuitry and for configuring oscillator cores with one of the first and second magnetic flux polarities.

In an embodiment, the received configuration information includes an indication for configuring at least one of a collective phase noise characteristic at the signal output circuitry or a collective electromagnetic interference characteristic of the multicore oscillator, and the controller is configured to control the selection circuitry based on the indication.

In an embodiment, the selection circuitry configures the plurality of oscillator cores such that there are no disabled oscillator cores between any two enabled oscillator cores in the array.

In an embodiment, the selection circuitry configures the plurality of oscillator cores such that there is at least one disabled oscillator core between two enabled oscillator cores in the array.

In an embodiment, the selection circuitry configures some of the enabled oscillator cores with the first magnetic flux polarity and the rest of the enabled oscillator cores with the second magnetic flux polarity for reducing the overall electromagnetic interference of the multicore oscillator.

In an embodiment, the selection circuitry comprises analog switches for each enabled oscillator core for connecting the oscillator core to the signal output circuitry in one of a first configuration where oscillation current flows through an inductor of its LC resonance tank in a first direction resulting in the first magnetic flux polarity, and a second configuration where oscillation current flows through the inductor of its LC resonance tank in a second direction opposite to the first direction resulting in the second magnetic flux polarity.

In an embodiment, the selection circuitry is configured to provide all of the enabled oscillator cores with the same magnetic flux polarity for reducing the overall phase noise of the multicore oscillator at the signal output circuitry.

In an embodiment, the apparatus is further configured to adjust one or more of the plurality of oscillator cores so that the plurality of oscillator cores are substantially matched to each other in oscillation amplitude and resonance frequency.

In an embodiment, there is at least one disabled oscillator core located physically closer to a victim circuitry located outside of the array of oscillator cores compared to all of the oscillator cores in the enabled subset for reducing the electromagnetic interference of the enabled subset at the victim circuitry.

In an embodiment, the apparatus is configured to power down the disabled remainder of the plurality of oscillator cores.

The foregoing summary provides some aspects and features according to the present disclosure but is not intended to be limiting. Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

DETAILED DESCRIPTION

Figure 1:
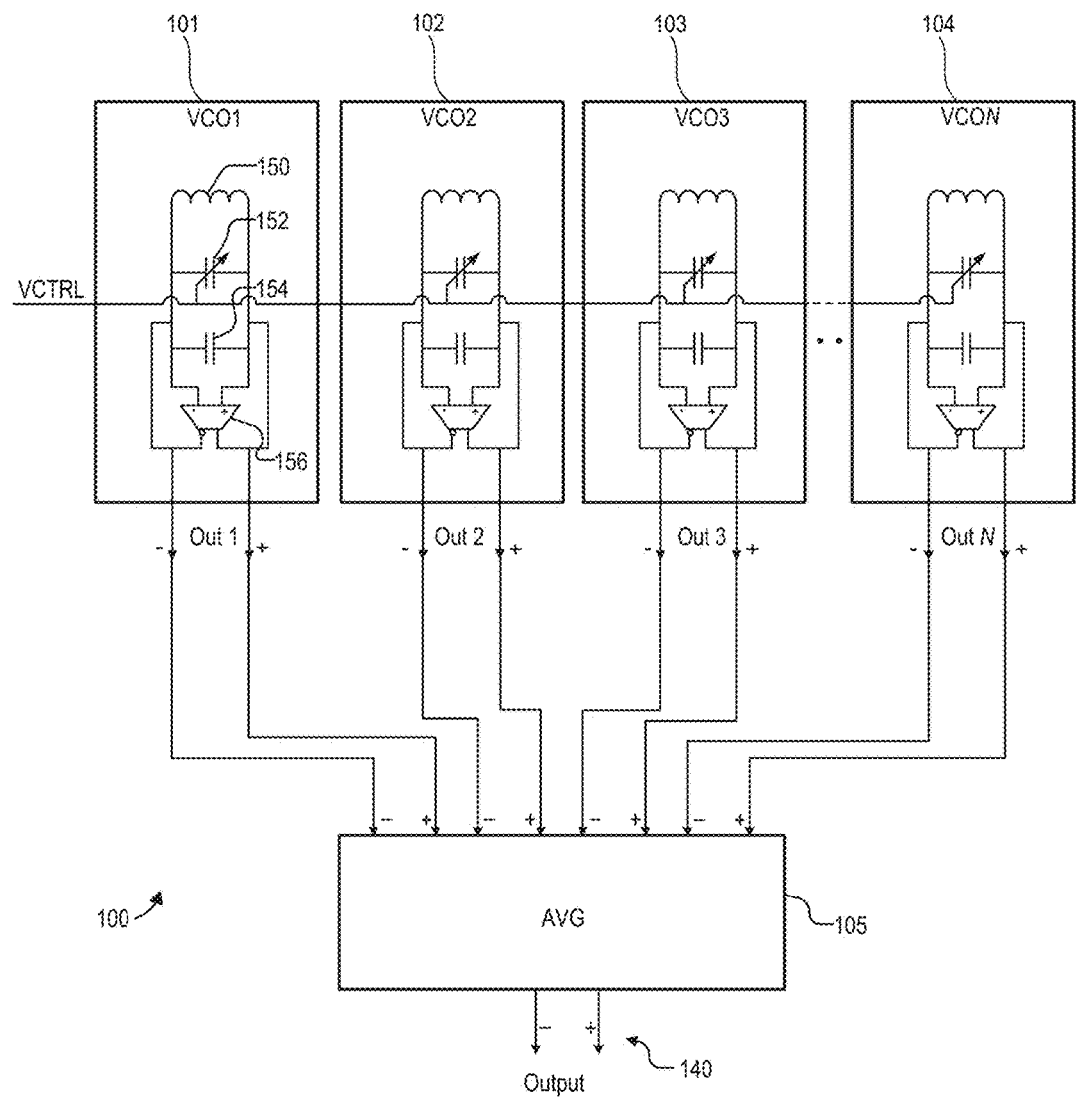
FIG. 1 is a block diagram of an example multicore VCO.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In addition, the present disclosure applies generally to multicore oscillators, and in at least some embodiments to LC oscillators. Although aspects and embodiments according to the present disclosure are described with reference to voltage controlled oscillators, this is not intended to be limiting. The teachings of the present disclosure apply to oscillators other than voltage controlled oscillators.

This disclosure generally relates to a reconfigurable multicore VCO comprising a plurality of VCO cores. The VCO cores are generally coupled by interconnect circuitry, referred to herein as an interconnect network, to a common electrical signal output of the multicore VCO. References herein to coupling a core to the interconnect network and references to coupling a core to the common electrical signal output generally mean the same thing. The coupling may be made directly (DC coupled), through capacitors (AC coupled), through transformers (magnetically coupled), or in any other suitable way.

The selective configuring of the VCO allows for adjustment of one or more properties or characteristics of the multicore VCO. The properties may include but are not limited to one or more of a collective phase noise characteristic at the common electrical signal output, a collective electromagnetic interference characteristic of the multicore VCO, and the collective power consumption of the multicore VCO.

A subset of the plurality of VCO cores may be selectively enabled while the remainder of the VCO cores may be simultaneously disabled. The ability to enable only a subset of the plurality of VCO cores allows the total number of enabled VCO cores to be reconfigurable. For example, enabling more VCO cores can reduce the overall oscillation phase noise of the multicore VCO, but can also increase the total EMI generated by the multicore VCO and increase the power consumption of the multicore VCO. On the other hand, enabling fewer VCO cores can reduce the total EMI generated by the VCO and can also reduce the overall power consumption of the VCO. However, reducing the number of enabled cores generally results in smaller achievable reduction in the overall oscillation phase noise of the VCO (i.e. overall phase noise increases).

Also, the ability to enable and disable particular VCO cores allows the physical placement of the enabled and disabled cores within the array to be reconfigured. For example, the locations of the enabled VCO cores relative to other nearby circuitry may be reconfigured or changed. This allows for some control over the effect of EMI generated by the enabled cores on the neighboring circuitry, sometimes referred to as victim circuitry. For example, in an embodiment, the subset of enabled VCO cores may be reconfigured to be the cores in the array that are physically located the farthest away from specific victim circuitry. However, the physical locations of the VCO cores that are enabled may be reconfigured in other ways, as described next.

The ability to enable and disable VCO cores can allow the spacing between adjacent enabled VCO cores within the array to be reconfigured. For example, enabled VCO cores can be concentrated (i.e. tightly spaced) together in the array, or they can be spaced apart from one another. For instance, in an embodiment, the multicore VCO can be reconfigured such that there is at least one disabled core between two or more enabled VCO cores. Configuring the spacing between enabled VCO cores allows a tradeoff. When VCO cores are tightly spaced there is more EMI interaction in between VCO cores, which can make the array modeling more tedious and can degrade phase noise, but there is smaller EMI interaction with any circuitry outside the array, and vice versa.

Furthermore, the direction in which oscillation current flows through the inductors of VCO cores may be reconfigured. The mention of the direction of current flow in a VCO core herein thus generally refers to the direction of current flow through the inductor of the core. In an embodiment, a subset of the enabled VCO cores may be reconfigured such that oscillation current flows through their cores in a first direction, while the remainder of the enabled VCO cores may be reconfigured so that oscillation current flows through their cores in the opposite direction. As a result, the subset and the remainder of the VCO cores will have opposite magnetic flux polarities. The EMI of two VCO cores configured to have opposite magnetic flux polarities will combine destructively to decrease the combined EMI of the two cores. Thus a multicore VCO having one or more VCO cores with a first magnetic flux polarity and one or more VCO cores with a second opposite magnetic flux polarity will generally have a lower combined EMI compared to a VCO with all cores configured to have the same magnetic flux polarity. Conversely, the EMI of VCO cores configured to have the same magnetic flux polarity will generally combine constructively to increase the combined EMI of the multicore VCO. Accordingly, reconfiguring the direction of the oscillation current in the enabled VCO cores generally provides some control over the overall EMI of the multicore VCO.

Utilizing the same magnetic flux polarity (or "direction") (H fields combining constructively) results in lower and thus better phase noise, ideally approaching the $10*\log_{10}(N)$ decibel improvement limit, where N is the number of VCO cores. On the other hand, utilizing opposite flux polarity, meaning H fields combining destructively, can degrade phase noise compared to the constructive combination case, but there is still phase noise benefit in adding more VCO cores. The degradation is related to a quality factor (Q) reduction in the destructive field case, the amount of which generally depends on spacing and shape of the inductors, among other parameters.

In an embodiment, one or more of the plurality of VCO cores are individually reconfigurable. In an embodiment, the multicore VCO may be reconfigured at run-time. In an embodiment, the multicore VCO may be reconfigured during manufacturing (e.g. metallization step in wafer fabrication). In an embodiment, the multicore VCO may be reconfigured during production, for example by programming fuses or anti-fuses on an integrated circuit device.

Providing reconfigurability of the multicore VCO at run-time, at manufacturing, or at production time may reduce the design effort, possibly including time-consuming electromagnetic field modeling and simulations, and allows for the tailoring of characteristics of the multicore VCO for a specific application after production.

In an embodiment, the selective reconfiguring of the VCO cores allows for adjustment and improvement of at least one of a collective phase noise characteristic of the multicore VCO at the common electrical signal output or a collective electromagnetic interference characteristic of the multicore VCO.

Reconfigurability of a multicore VCO may be provided at least in part by selection circuitry forming part of, or coupled to, the interconnect network connecting the VCO cores in the array. The selection circuitry may be used to enable and disable VCO cores, for example by coupling or decoupling, respectively, each VCO core from the interconnect network. Additionally or alternatively, the selection circuitry may be used to reconfigure the direction of the oscillation current in one or more enabled VCO cores.

In an embodiment, the selection circuitry comprises an array of analog switches, such as complementary metal oxide semiconductor (CMOS) transmissions gates, for selectively coupling the output of each VCO core to the common electrical signal output. The outputs of the VCO cores are generally analog nodes that carry sinusoidal oscillation signals of the VCO cores. Thus the analog switches are analog in the sense the signal passing through the switch is analog, while the controlling circuit of the switches is generally digital. In an embodiment, reconfigurability of the multicore VCO may be provided at least in part by one-time programmable circuits, such as electronic fuses or electronic anti-fuses, in the interconnect network. One-time programmable schemes permit one-time reconfiguration of the cores during manufacturing or at production. In an embodiment, reconfigurability of the multicore VCO may be provided at least in part by metal mask sets during manufacturing. In an embodiment, reconfigurability of the multicore VCO may be provided at least in part by other selection circuitry. In an embodiment, the selection circuitry may be reconfigured to connect one or more VCO cores to a common electrical signal output in one of a first configuration where oscillation current flows through the core in a first direction and a second configuration where oscillation current flows through the core in a second direction opposite to the first direction.

The present disclosure may be applicable to VCO applications having demanding phase noise or random jitter requirements, for example but not limited to multi-standard wireline 10+ Gb/s serializer-deserializer (SERDES) applications, or local oscillators (LOs) in multi-standard RF wireless applications. Embodiments provide a reconfigurable design having flexibility to trade off between two or more of phase noise, EMI, and power dissipation of a multicore VCO.

Figure 2A:
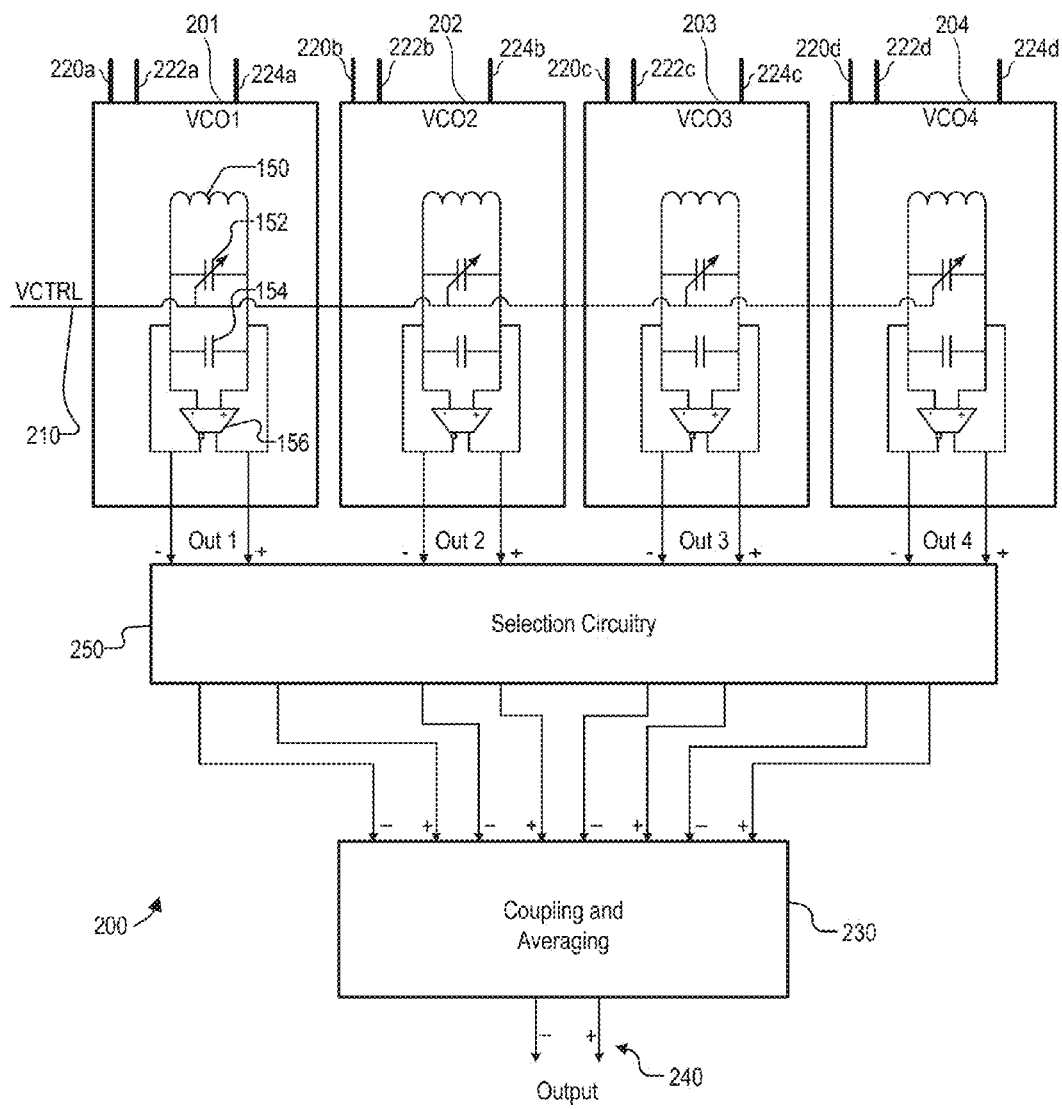
FIG. 2A is a block diagram of an example reconfigurable multicore VCO according to the present disclosure.

FIG. 2A is a block diagram of a reconfigurable multicore VCO system 200 according an embodiment of the present disclosure. Although the reconfigurable multicore VCO system 200 is shown having 4 VCO cores, it is to be understood that the reconfigurable multicore VCO system 200 can have any practical number of VCO cores.

The reconfigurable multicore VCO system 200 comprises four VCO cores 201, 202, 203, 204, individually designated as VCO1, VCO2, VCO3, VCO4 respectively for ease of reference. Although each VCO core is shown as having an inductor 150, varactor 152, capacitor 154, and driver 156, the VCO cores may have different topologies or components in other embodiments.

The varactors of the VCO cores 201, 202, 203, 204 are all connected to be controlled by a single control voltage VCTRL at a common control input 210 to fine tune the desired output frequency and phase of the VCO.

The VCO cores 201, 202, 203, 204 are electrically connected in parallel. The outputs (e.g. oscillation signals) of the VCO cores, designated as Out 1, Out 2, Out 3, Out 4, respectively, are averaged by a coupling and averaging circuit 230, connected to each VCO core output via a selection circuitry 250, and the average is output on a common electrical signal output 240. The common electrical signal output 240 of coupling and averaging circuit 230 may be used to generate a single output of the multicore VCO array, the single output comprising an average of the selected individual outputs of the VCO cores 201, 202, 203, 204. The coupling aspect of the coupling and averaging circuit 230 ensures that signals from multiple VCOs are in sync as opposed to running asynchronously.

The outputs of the VCO cores 201, 202, 203, 204 are connected to each other and to the respective inputs of coupling and averaging circuit 230 through an interconnect network, which according to an aspect of the present disclosure comprises selection circuitry 250 as shown in FIG. 2A. Since the selection circuitry 250 may vary from embodiment to embodiment, the details of selection circuitry 250 are not shown in box 250. Each VCO core output may have a positive terminal and a negative terminal, labeled as '+' and '−' in FIG. 2A, and the common electrical signal output 240 may have corresponding positive and a negative conductor, also labeled as '+' and '−'. Although the cores in this embodiment are double-ended cores (i.e. having two terminals) also known as differential, it is to be appreciated that embodiments having single-ended cores (i.e. having a single terminal) are also contemplated.

Selection circuitry 250 provides at least some reconfigurability of the VCO system 200. Selection circuitry 250 may be selectively reconfigurable to electrically couple a subset of the VCO cores in the array to the common electrical signal output 240 and to electrically decouple the remainder of the subset of VCO cores in the array from the common electrical signal output 240. The coupling of the subset of VCO cores to the common electrical signal output 240 enables the subset, while the decoupling of the remainder of the VCO cores disables those cores. In an embodiment, enabling a core involves powering up the core and disabling a core involves powering down the core.

Additionally or alternatively, selection circuitry 250 may be selectively reconfigurable to configure the direction in which the oscillation current flows through one or more of the VCO cores. A core may be configured so that the oscillation current flows in a first direction or in a second, opposite direction. The direction of the oscillation current in a core determines the magnetic flux polarity of the core.

Additionally or alternatively, selection circuitry 250 may be selectively reconfigurable to configure the connection polarity of each core to coupling and averaging circuitry 230. For example, selection circuitry 250 may be configured to connect the positive and negative outputs of VCO1 core (Out 1) to positive and negative inputs, respectively, of coupling and averaging circuitry 230. In another configuration, selection circuitry 250 may be configured to connect the outputs of a core to inputs of coupling and averaging circuitry 230 with the opposite polarity, meaning connecting the positive and negative outputs of VCO1 core (Out 1) to negative and positive inputs, respectively, of coupling and averaging circuitry 230.

In an embodiment, the configuring the selection circuitry comprises configuring switches for each VCO core to be enabled to connect the VCO core to the common electrical signal output 240 in one of a first configuration where oscillation current flows through the core in a first direction resulting in the first magnetic flux polarity for the core, and a second configuration where oscillation current flows through the core in a second opposite direction opposite to the first direction resulting in the second magnetic flux polarity for the core.

Figure 2B:
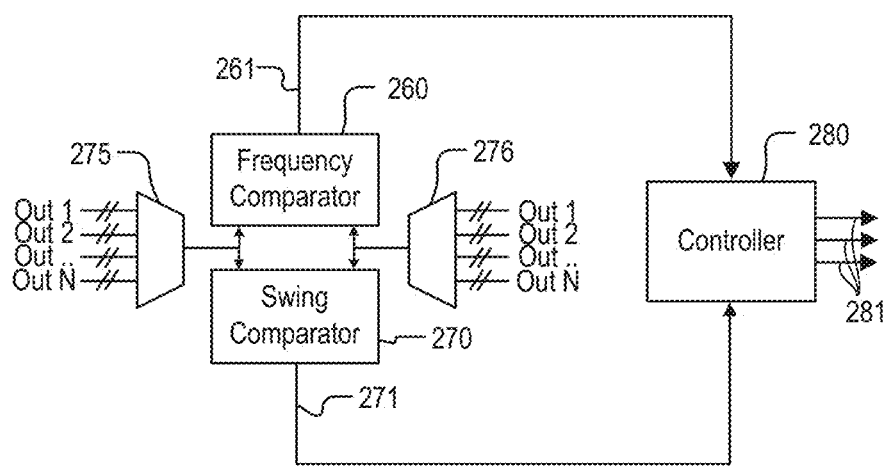
FIG. 2B is a block diagram of a frequency comparator and a swing comparator.
Figure 3:
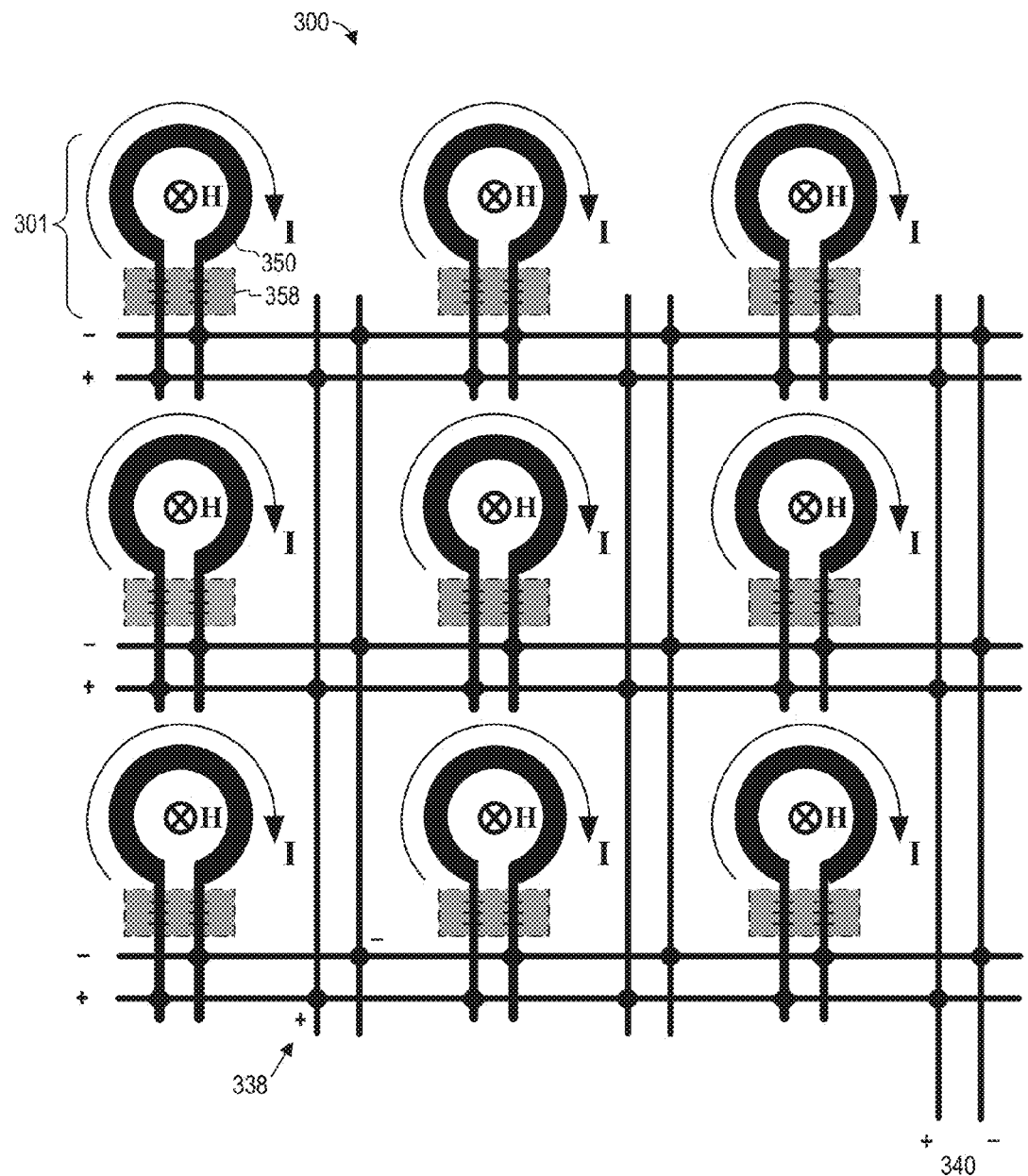
FIG. 3 is a diagram of an array of VCO cores in an embodiment, wherein the oscillation current is configured to flow in the same direction in the inductors of all enabled cores.

FIG. 3 shows an example array 300 of VCO cores 301 in an embodiment of a multicore VCO according to the present disclosure. The cores are illustrated differently in FIG. 3 relative to FIGS. 1 and 2 for ease in visually indicating the direction of current flow and the magnetic flux polarities of the cores. In addition, some components of the multicore VCO are not shown in FIG. 3 for clarity.

VCO core 301 generally comprises inductor 350 and other core circuitry represented by grey box 358. In an embodiment, the other core circuitry 358 may comprise components similar to those shown in FIGS. 1 and 2A, namely capacitor 154, varactor 152, and gain stage 156. Horizontal dash lines on 358 represent electrical connections between inductor 350 leads (terminals) and VCO core circuitry 358. For drawing simplicity a single-turn, two-dimensional inductor 350 is depicted; however the inductor 350 can have various layout structures and features, including multiple turns, stacked layers or center tap(s).

In the embodiment of FIG. 3, array 300 is configured such that all 9 cores are electrically coupled to a conductive interconnect network 338. More specifically, the positive terminal and negative terminal of each core, labeled as '+' and '−', are coupled to corresponding common positive and negative conductive links in the interconnect network 338, also labeled as '+' and '−'. A common electrical signal output 340 of the multicore VCO may be electrically coupled to or form part of the interconnect network 338.

The arrow shown at each core indicates the direction of current (I) flow through the core. Also, the magnetic flux polarity of each core is indicated at the center of each core and labeled with an 'H'. The embodiment of FIG. 3 is configured so the current (I) through every core flows in the same direction, as indicated by the arrows at each core pointing in the same clockwise direction. Accordingly, the magnetic flux polarity of all of the cores is also the same, namely in the direction of into the page according to the right-hand-rule and indicated by the small circle containing a cross (⊗) in the center of each core inductor.

In the embodiment of FIG. 3, the overall phase noise of the multicore VCO can be low since the current flows through the inductors of all of the cores in the same direction. However, the same current flow generally results in higher overall EMI produced by the multicore VCO.

Figure 4:
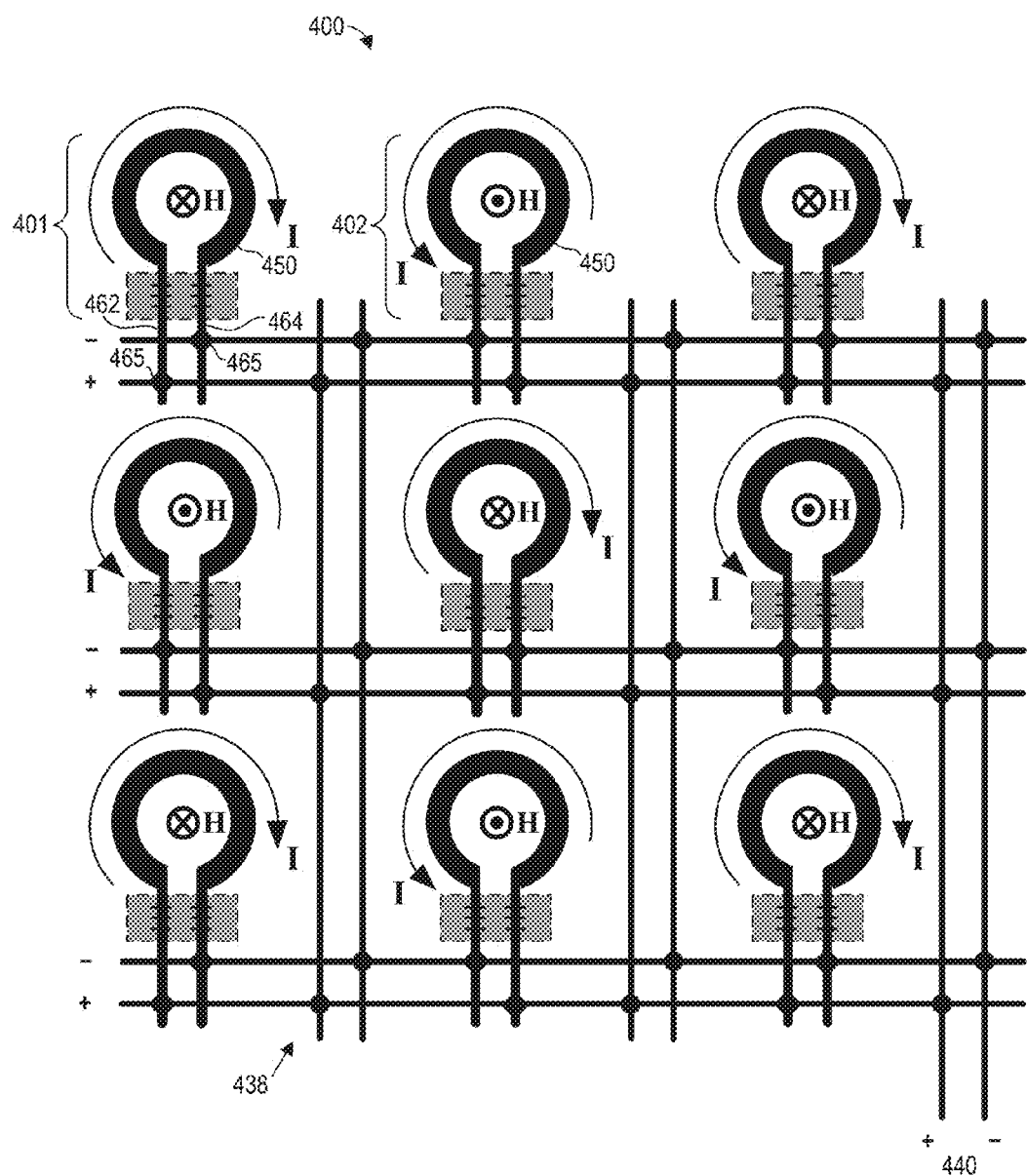
FIG. 4 is a diagram of an array of VCO cores in an embodiment, wherein the oscillation current is configured to flow in different directions in the inductors of different enabled cores.

FIG. 4 is a representation of another example array 400 of VCO cores in an embodiment of a multicore VCO according to the present disclosure. Array 400 is also configured such that all 9 cores are electrically coupled to a conductive interconnect network 438. A common electrical signal output 440 of the multicore VCO may be electrically coupled to, or form part of, the interconnect network 438. However, this embodiment is configured so the current (I) through different cores flows in opposite directions in an alternative arrangement, as indicated by the arrows at each core inductor 450 pointing in different directions. In this regard, some of the enabled VCO cores have the first magnetic flux polarity and the rest of the enabled VCO cores have the second magnetic flux polarity. For example, array 400 is configured so current through the inductor 450 of core 401 flows in a first direction while the current through the inductor 450 of core 402 flows in the opposite direction. As a result, the magnetic flux polarities of cores 401 and 402 are opposite to each other. The magnetic flux polarity of core 401 is oriented into the page according to the right-hand-rule and indicated by the small circle containing a cross (⊗) in the center of core 401, whereas the magnetic flux polarity of core 402 is oriented out of the page as indicated by the small circle containing a dot (⊙) in the center of inductor 450 of core 402.

The opposite current flow directions in various cores is achieved by configuring how each core is electrically coupled to the common positive and negative conductive links in the interconnect network 438. For example, a first terminal 462 of core 401 is coupled to a positive (+) conductive link of interconnect network 438, while a second terminal 464 of core 401 is coupled to a negative (−) conductive link of interconnect network 438. The coupling is represented in the figure by the connection nodes 465. It is to be appreciated that the connection nodes 465 are used to generally represent a coupling of the terminals of a core VCO inductor to the interconnect network 438. However, in some embodiments, described later, the terminals of a core are coupled to the interconnect network 438 via one or more switches or other circuitry (not shown in FIG. 4).

In the embodiment of FIG. 4, the configured current direction in the cores alternates along each row and each column of the array 400. The differing magnetic flux polarities of the various cores generally results in lower overall EMI produced by the multicore VCO. However, the current flowing through some of the cores in one direction and through the rest of the cores in the opposite direction generally does not result in as low overall phase noise of the multicore VCO compared to embodiments in which a majority or all of the cores have current flowing in the same direction.

Figure 5:
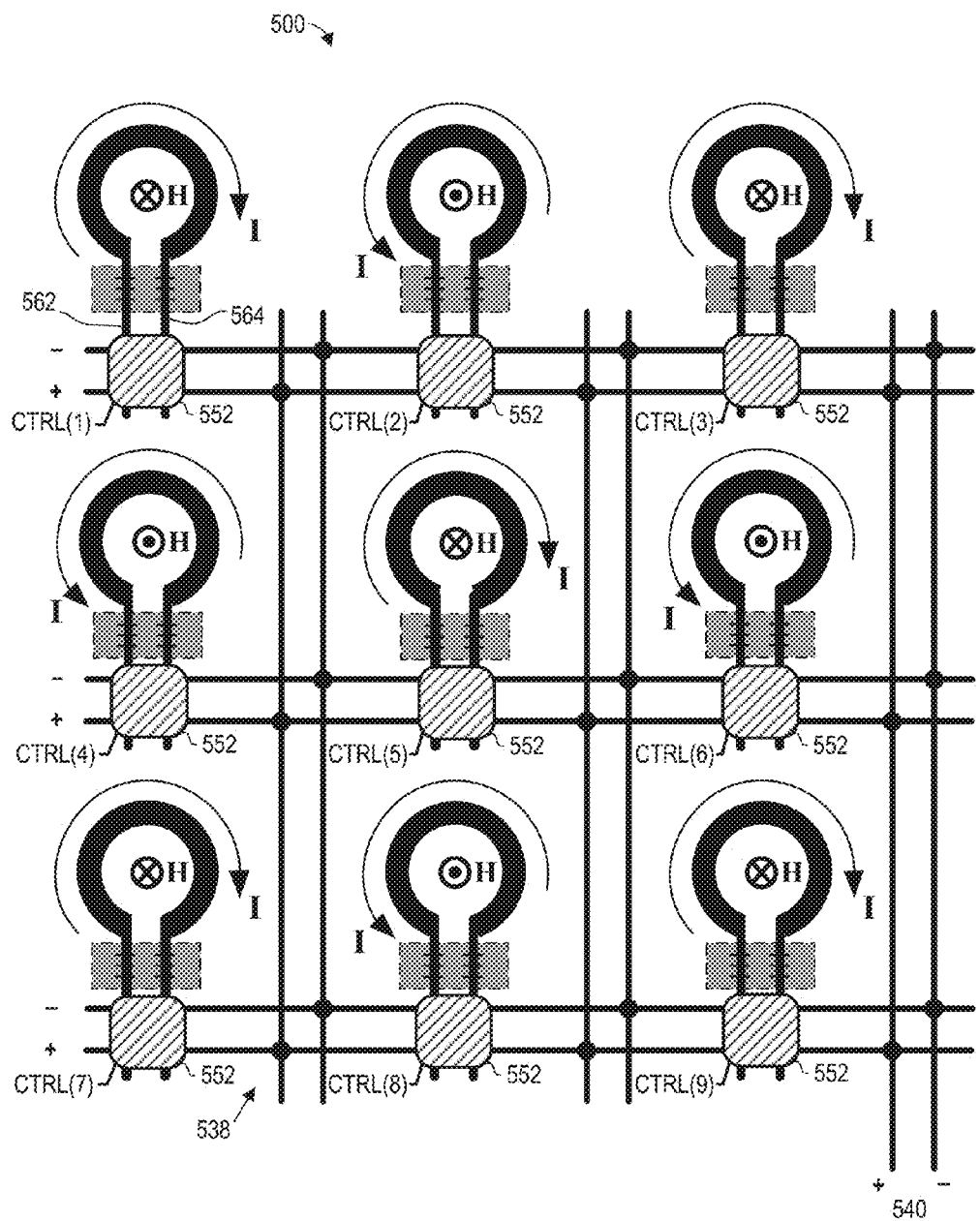
FIG. 5 is a diagram of an array of VCO cores in an embodiment where the cores are electrically coupled to the interconnect network via reconfigurable selection circuitry.

FIG. 5 is a diagram of an array of VCO cores 500 in an embodiment where the cores are each electrically coupled to an interconnect network 538 via a reconfigurable selection circuitry 552, which is different from the embodiments of FIGS. 4 and 5 that are shown as having fixed connections to the interconnect network. In FIG. 5, the reconfigurable selection circuitry 552 for each core is represented with a generic box with hatching, each selection circuitry 552 receiving a digital control signal CTRL(i), i=1, 2, . . . , N, where N is the number of cores. Controlled by a digital state of CTRL(i), the selection circuitry 552 is reconfigurable to electrically couple first and second terminals 562 and 564 to positive (+) and negative (−) conductive links of interconnect network 538 in one of at least two configurations. In one configuration, selection circuitry 552 electrically couples first and second terminals 562 and 564 to positive (+) and negative (−) conductive links, respectively. In another configuration, selection circuitry 552 electrically couples first and second terminals 562 and 564 in an opposite manner, namely to negative (−) and positive (+) conductive links, respectively. A similar embodiment is described further below with reference to FIG. 13. The multicore array 500 further comprises a common electrical signal output 540 electrically coupled to or forming part of an interconnect network 538.

Figure 6:
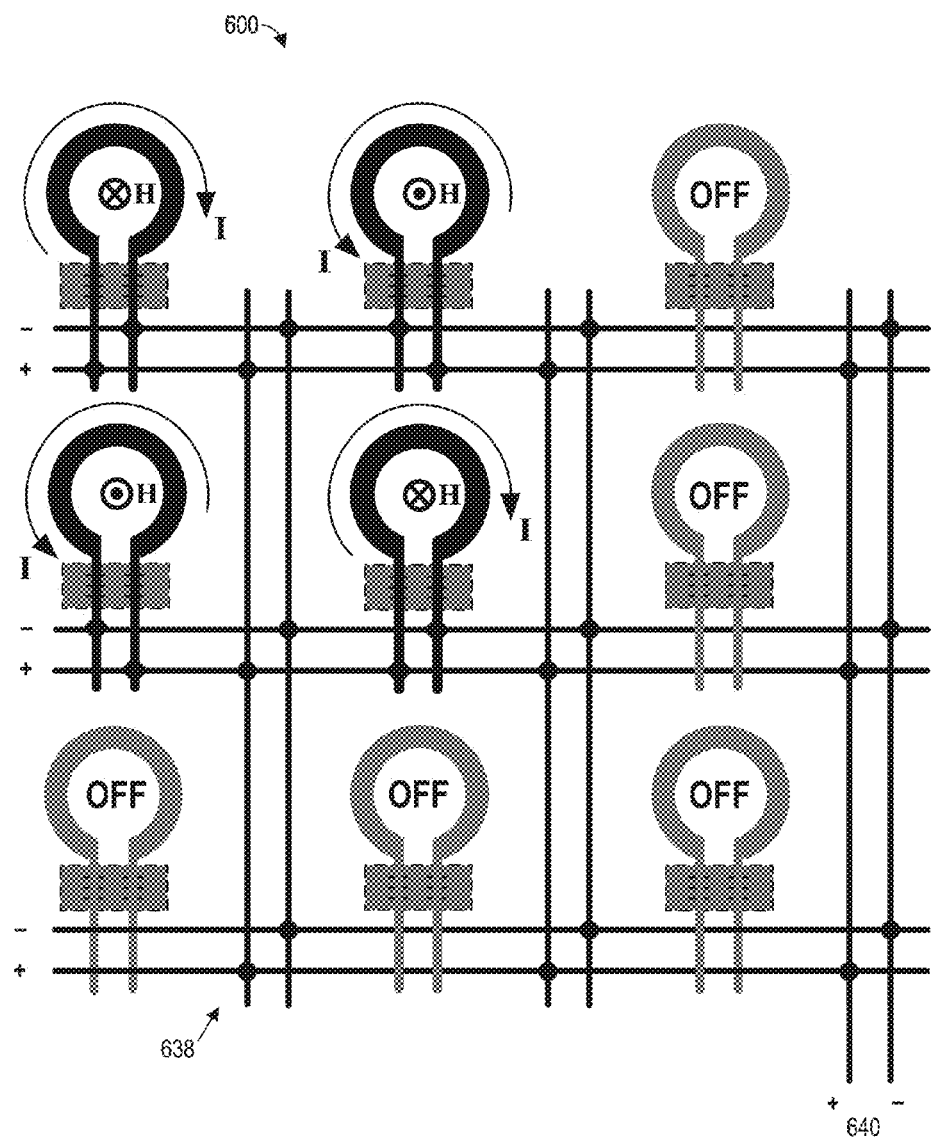
FIG. 6 is a diagram of an array of VCO cores in an embodiment, wherein only a subset of the cores is enabled.

FIG. 6 is a representation of another example array 600 of VCO cores in an embodiment of a multicore VCO according to the present disclosure. Unlike the embodiments of FIGS. 3 to 5, array 600 is configured such that some but not all (i.e. a subset) of the 9 cores are electrically coupled to the conductive interconnect network 638. Specifically, 4 cores in the upper left region of the array 600 are coupled to interconnect network 638 and are thus enabled, whereas the cores in the lowest row and in the rightmost column are decoupled from interconnect network 638 and are thus disabled. These 5 decoupled cores are labeled as "OFF". This embodiment is also configured so the current (I) through different enabled core inductors flows in opposite directions. The multicore array 600 also comprises a common electrical signal output 640 of the multicore VCO electrically coupled to or forming part of an interconnect network 638.

The embodiment of FIG. 6 is an example of how the ability to enable and disable particular VCO cores allows the physical location of the enabled and disabled cores within the array to be configured. In this particular embodiment, the multicore VCO is configured so that cores in the upper left region of the array are coupled to the interconnect network 638 and are thus enabled, while the remainder of the cores are decoupled and thus disabled. In this sense, the enabled cores are physically clustered and concentrated together. In some embodiments, such as this one, the VCO may be configured such that there are no disabled VCO cores between any two enabled VCO cores in the array. In other embodiments, the VCO may be configured so there are one or more disabled VCO cores between enabled VCO cores in the array but the enabled cores are still concentrated together, although to a lesser degree. The particular cores selected to be enabled may be chosen for one or more reasons, including their relative location to other circuitry or devices ("victim circuitry") or a preference to cluster the enabled cores together, without limitation.

In addition, the embodiment of FIG. 6 is an example of disabling some of the cores of the plurality of total cores in the multicore oscillator array 600 to reduce the overall power consumption of the multicore oscillator. The disabled cores are generally in a powered down state and thus consume little or no power. Therefore disabling more cores in the multicore oscillator generally reduces the overall power consumption of the oscillator. However, decreasing the number of enabled cores generally causes an increase in collective phase noise of the multicore oscillator. In this regard, there is a tradeoff between (low) collective phase noise and overall power consumption of the multicore oscillator.

In the embodiment of FIG. 6, 5 out of the 9 cores are disabled (56% disabled). The percentage of disabled cores may vary in other embodiments. In some embodiments aimed at low-power applications, the number of cores that are disabled and powered down can be at least 40%, 50%, 60%, 70%, 80%, or any other suitable value, of the total number of cores in the multicore oscillator, depending on a desired tradeoff between collective phase noise and overall power consumption.

Figure 7:
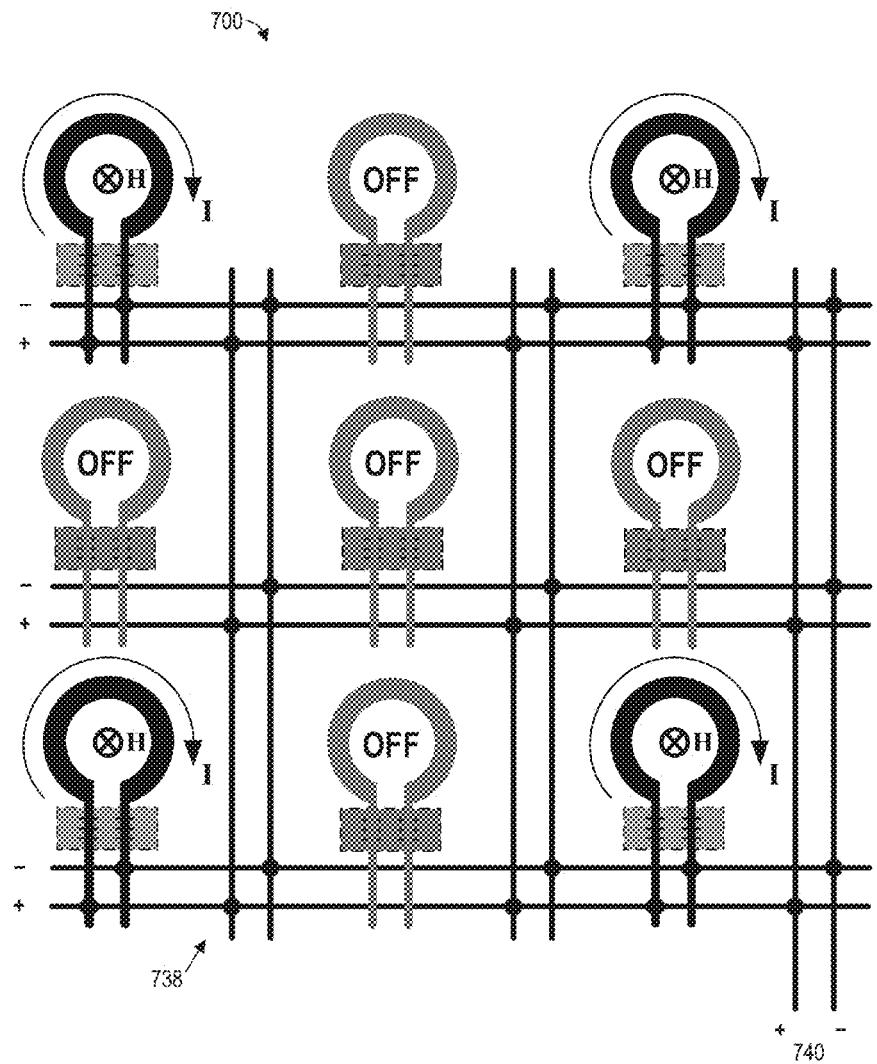
FIG. 7 is a diagram of an array of VCO cores in an embodiment, wherein a different subset of the cores is enabled.

FIG. 7 is a representation of another example array 700 of VCO cores in an embodiment of a multicore VCO according to the present disclosure. Similar to the embodiment of FIG. 6, array 700 is configured to have some but not all (i.e. a subset) of the 9 cores electrically coupled to the conductive interconnect network 738. However, the embodiment of FIG. 7 has some different cores enabled and disabled. Specifically, the core in each corner of the array 700 is coupled to interconnect network 738 and are thus enabled. The remaining 5 cores are decoupled from interconnect network 738 and are thus disabled. In the configuration of enabled cores in FIG. 7, there is more electromagnetic isolation (i.e. less interaction) between the VCO cores within the array, but less isolation (more EMI) to external circuitry outside and near the array. In addition, this embodiment is configured so the current (I) through the 4 enabled cores flows in the same direction. In addition, the multicore array 700 comprises a common electrical signal output 740 electrically coupled to or forming part of the interconnect network 738.

The embodiment of FIG. 7 is another example of how the ability to enable and disable particular VCO cores allows the physical location of the enabled and disabled cores within the array to be configured. The embodiment of FIG. 7 is configured so that the enabled cores are dispersed, meaning they are less concentrated together compared to the embodiment of FIG. 6. In the embodiment of FIG. 7, the enabled cores are separated by a disabled core in both the column and row directions. More generally, in some embodiments, a multicore VCO may be configured such that there is at least one disabled VCO core between any two enabled VCO cores in the array.

Configuring a multicore VCO array so that at least some of the enabled cores are located farther away from each other may reduce the interaction of the inductors in the cores on the inductors in other cores (i.e., more electromagnetic isolation in between the cores) and may thus increase the overall Q factor of the LC tank and hence improve the phase noise of the multicore VCO. However, the spreading of the enabled cores over a larger surface area may result in the EMI generated by the multicore VCO also effectively covering more area compared to an embodiment where the enabled cores are more concentrated together.

The phase noise difference between configurations in which all the currents of the cores flow in the same direction (constructive EMI coupling) and configurations in which the currents of the cores flow in different directions (destructive EMI coupling) gets smaller as the spacing (distance, d) between enabled core inductors increases. Quality factor and phase noise of the multicore oscillator tends to degrade due to destructive field interaction between core inductors. Nonetheless, this interaction effect is generally mitigated as the distance between the core inductors increases. Some example data indicative of this relationship is as follows: in the case of a small array with N=2, the degradation in phase noise due to destructive coupling between the two inductors is approximately 0.2 dB or smaller when d≥40 µm, approximately 0.5 dB when d=20 µm, and equal to, or greater than, 1 dB when d=12-15 µm. Consequently, in some embodiments the reconfigurability of the VCO allows for tighter core spacing, and thus tighter inductor spacing, which saves area on the semiconductor die or other substrate structure.

The embodiments of FIGS. 3 to 7 are provided as examples only and are not meant to be limiting. The layout, composition, and/or configuration of a multicore VCO may differ in other embodiments. This includes, but is not limited to, the number of cores in the array, the size of the array, the shape of the array, the number and locations of enabled and disabled cores, the distance between the core inductors, and the configured magnetic flux polarities of the core inductors.

Figure 8:
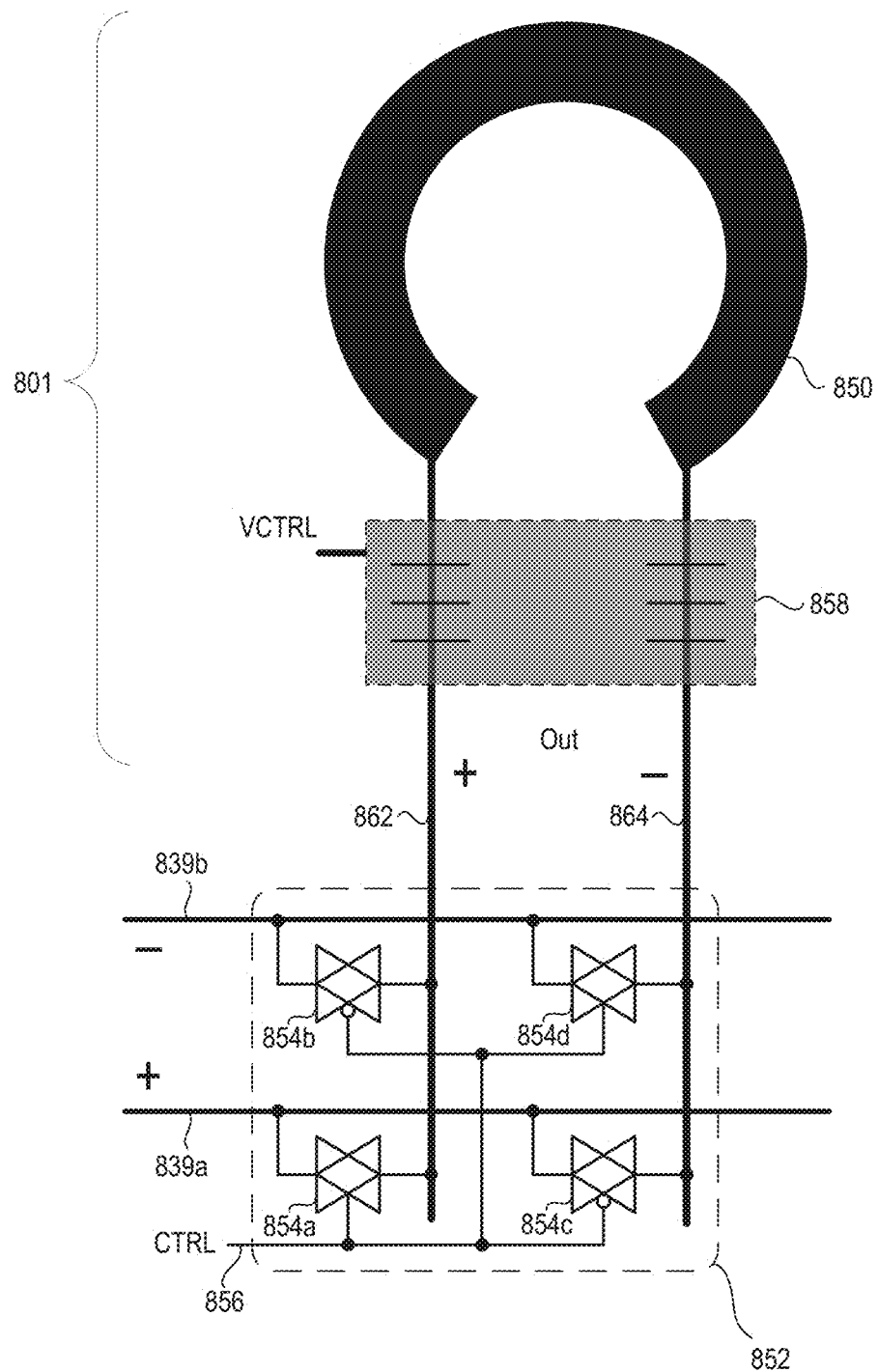
FIG. 8 is a diagram of selection circuitry for coupling a VCO core to conductive links of an interconnect network in an embodiment.

FIG. 8 shows selection circuitry 852 for coupling a VCO core 801 to conductive links 839a, 839b of an interconnect network in an embodiment according to the present disclosure. VCO core 801 comprises an inductor 850 and other core circuitry 858, as previously described in other embodiments. Also shown is an analog control voltage input (VC-TRL) for core circuitry 858. The selection circuitry 852 may be used to connect a VCO core to the interconnect network in embodiments, such as the embodiments shown in FIGS. 2 to 7. For some embodiments, the selection circuitry for a VCO core may be referred to as a reconfigurable switching circuit.

In the embodiment of FIG. 8, selection circuitry 852 comprises electronic switches 854a, 854b, 854c, 854d for selectively coupling and decoupling the terminals 862, 864 of core 801 to conductive links 839a, 839b. The switches are shown as transmission gates, but the type of switch may differ in other embodiments. In addition, a control line 856 is provided and coupled to the switches for enabling and disabling the switches. A digital control signal (CTRL) may be applied to control line 856 for enabling the switches. In a multicore VCO, two or more separate control lines may be provided to separately control selection circuitry 852 of each of two or more subsets of the cores.

A first signal value (e.g. CTRL=1) applied to control line 856 enables switches 854a and 854d and disables switches 854b and 854c, thereby coupling positive terminal 862 of the core to the positive conductive link 839a and coupling negative terminal 864 of the core to the negative conductive link 839b of the interconnect network.

In a different configuration, selection circuitry 852 is configured so the coupling of the positive and negative terminals 862, 864 of the core to the positive and negative conductive links 839a, 839b is reversed. In particular, a second signal value (e.g. CTRL=0) applied to control line 856 enables switches 854b and 854c and disables switches 854a and 854d, thereby coupling positive terminal 862 of the core to the negative conductive link 839b and coupling negative terminal 864 of the core to the positive conductive link 839a of the interconnect network.

Figure 9:
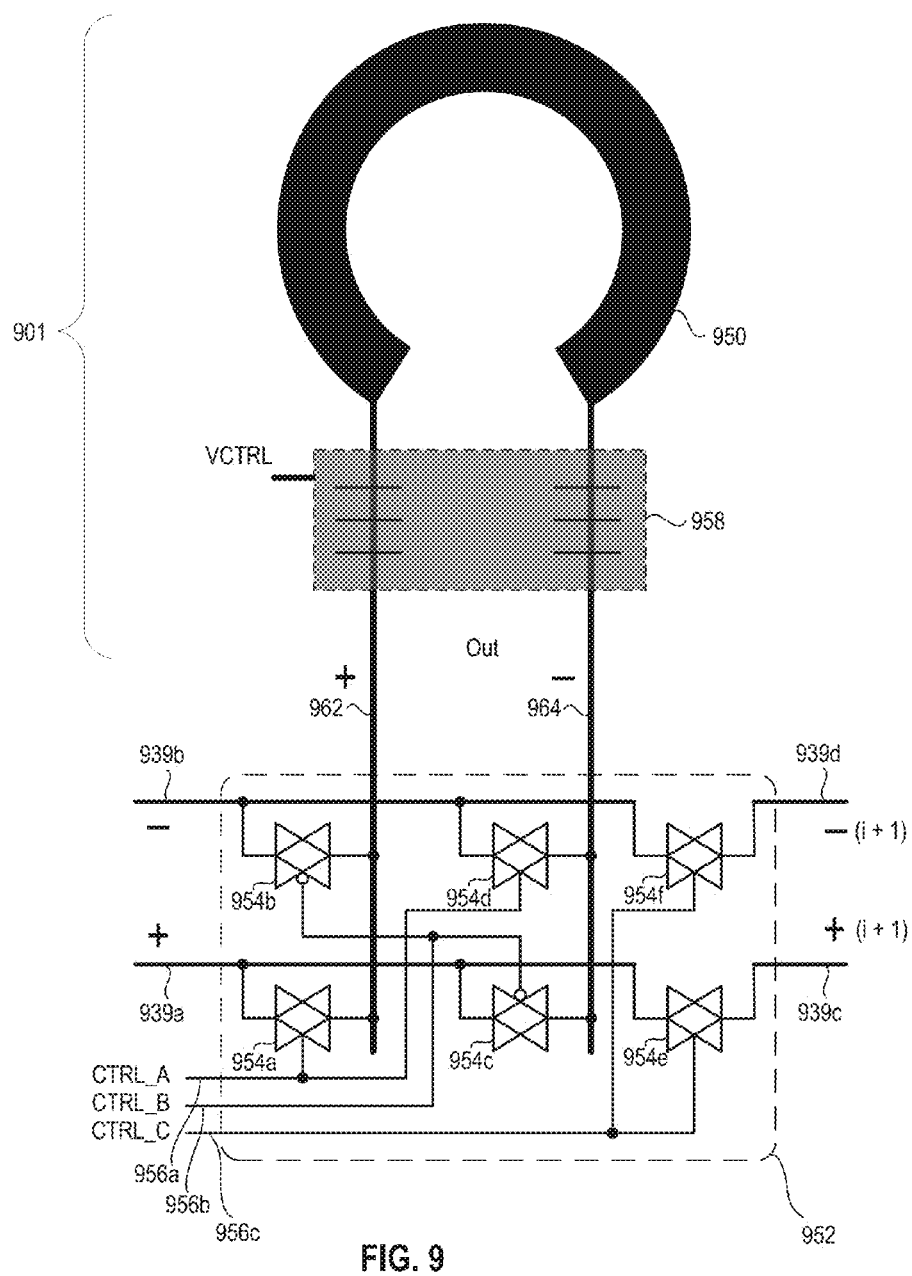
FIG. 9 is a diagram of other selection circuitry for coupling a VCO core to conductive links of an interconnect network in an embodiment.

FIG. 9 shows selection circuitry 952 for coupling a VCO core 901 to conductive links 939a, 939b of an interconnect network in another embodiment according to the present disclosure. Conductive links 939c, 939d of the interconnect network may be electrically connected to the terminals of another core (i.e. the ith+1 core). Unlike FIG. 8, in the embodiment of FIG. 9, selection circuitry 952 may be configured to decouple the core 901 from conductive links of the interconnect network. Selection circuitry 952 has 3 control lines 956a, 956b, 956c to which up to 3 digital control signals CTRL_A, CTRL_B, CTRL_C may be applied, respectively, to control the various switches 954a-954e.

Control line 956a is coupled to switches 954a and 954d. Control line 956b is coupled to switches 954b and 954c. Control line 956c is coupled to switches 954e and 954f. The signals applied to these control lines cause the selection circuitry to be configured as shown below in Table 1:

TABLE 1

| Configuration | CTRL_A | CTRL_B | CTRL_C |
|---|---|---|---|
| VCO core current (I): ON, Clockwise | 1 | 1 | X |
| VCO core current (I): ON, Counter Clockwise | 0 | 0 | X |
| VCO core current (I): OFF | 0 | 1 | X |
| Connect the left hand side conductive links 939(a-b) to the rest of the interconnect network 939(c-d) on the right hand side | X | X | 1 |
| Disconnect the left hand side conductive links 939(a-b) from the rest of the interconnect network 939(c-d) on the right hand side | X | X | 0 |

As shown in the first row of Table 1, applying control signal CTRL_A=1 to control line 956a turns switches 954a and 954d on to couple positive and negative terminals 962, 964 to positive and negative conductive links 939a, 939b, respectively. Applying control signal CTLR_B=1 to control line 956b turns switches 954b and 954c off to decouple the positive terminal 962 from the negative conductive link 939b, and to decouple the negative terminal 964 from the positive conductive link 939a. This configuration of switches 954a-954d results in an oscillation current in core 901 flowing in the clockwise direction.

In another configuration, as shown in the second row of Table 1, the positive and negative terminals 962, 964 of the VCO core are coupled to the positive and negative conductive links 939a, 939b in the opposite direction to produce an oscillation current in core 901 in the counter clockwise direction. In particular, applying control signals CTRL_A=0, CTRL_ B=0 to control lines 956a, 956b, respectively, turns switches 954a and 954d off and turns switches 954b and 954c on.

In another configuration, as shown in the third row of Table 1, all of switches 954a to 954d are turned off to completely decouple the VCO core from the positive and negative conductive links 939a, 939b. This is achieved by applying control signals CTRL_A=0, CTRL_B=1 to control lines 956a, 956b, respectively. Accordingly, this configuration may be selected to disable the core 901 in a multicore VCO.

The embodiment of FIG. 9 further comprises switches 954e and 954f, which are coupled to positive and negative conductive links 939a, 939b, respectively. Control line 956c, to which a control signal CTRL_C may be applied, controls switches 954e and 954f. Independent from the controls CTRL_A and CTRL_B, the CTRL_C control signal determines whether or not the rest of the interconnect line (to the right side in FIG. 9) in that row is to be connected to the common interconnect network. For a given core, if all cores to the right side of this core are OFF, then CTRL_C may be set to 0 to disconnect the redundant conductive links (e.g. wires) going to the right side. This is to reduce loading capacitance and antenna effect from the unused wires. If a core anywhere to the right side of a given core is ON, then CTRL_C is set to 1 to keep the connection to the right side.

For example, referring to FIG. 6, for the cores that are off, and the cores in the middle column that are on, the CTRL_C control signal may be set to 0 to disconnect the redundant interconnects to the right side. For the cores that are on in the left column, the CTRL_C control signal is set to 1.

As another example, referring to FIG. 7, for all cores (on or off) in the left and middle columns, the CTRL_C control signal is set to 1. For all cores in the right column, the CTRL_C control signal may be set to 0 so as to disconnect the redundant lines.

Although the CTRL_C control signal and switches 954e and 954f are described as being used to disconnect redundant (unused) conductive links to the "right" in FIG. 9, it is to be appreciated that they may be used to disconnect any unused conductive links. In other words, reference to redundant conductive links to the "right" is used only as an example in FIG. 9 and is not meant to be limiting.

Embodiments having selection circuitry for selectively configuring and coupling VCO cores to other VCO cores or a common electrical signal output have been described including with reference to FIGS. 8 and 9. Although selection circuitry is shown in FIGS. 8 and 9 as comprising transmission gate switches, it is to be appreciated that other types of switches or other types of selection circuitry may be used in other embodiments. For example, in some embodiments, the selection circuitry may comprise one-time programmable circuits, such as electronic fuses or electronic anti-fuses. In other embodiments, the selection circuitry may include any other type of suitable circuitry or switches.

Referring back to the multicore VCO system 200 of FIG. 2A, in at least one embodiment, some or all of the plurality of VCO cores are substantially matched to each other in at least one of oscillation amplitude and resonance frequency. In some embodiments, the VCO cores are substantially matched to each other in both oscillation amplitude and resonance frequency.

Figure 10A:
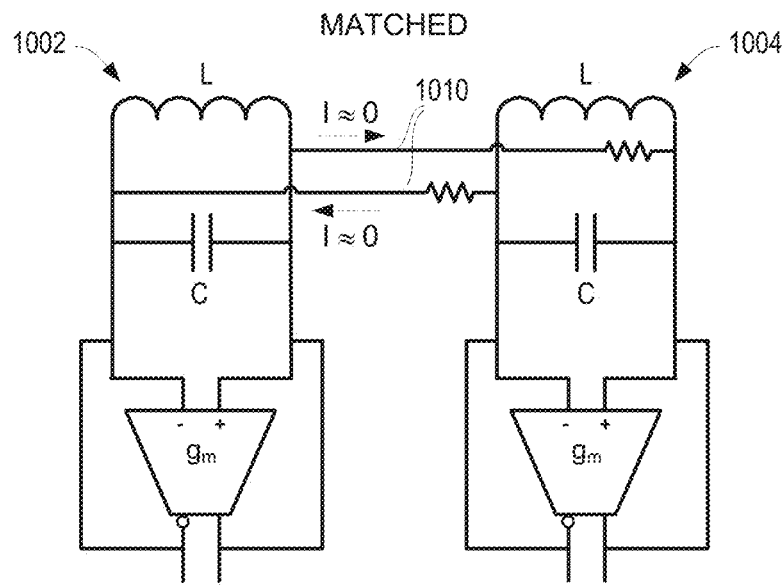
FIG. 10A is a diagram of a multicore VCO array with matched circuits.
Figure 10B:
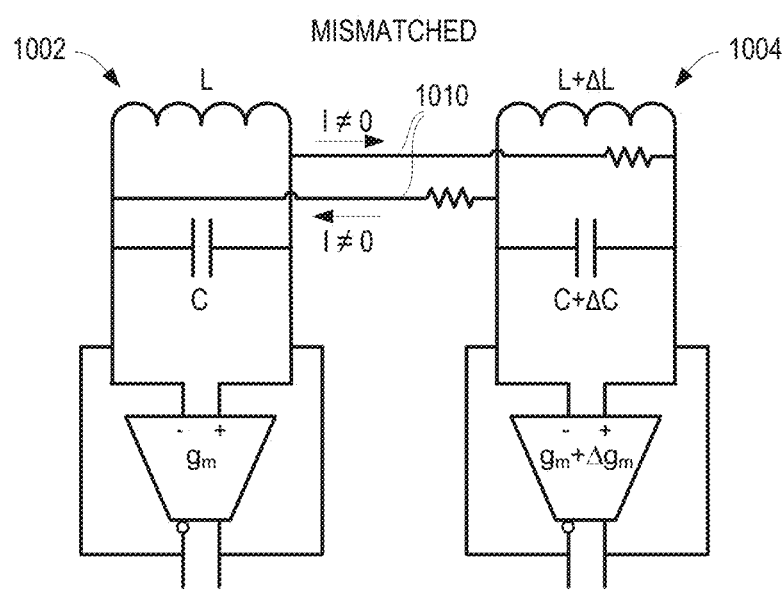
FIG. 10B is a diagram of a multicore VCO array with mismatched circuits.

While the VCO cores in a multicore array may be designed to have the same electrical characteristics, the individual elements of each core in a real device generally do not have completely identical characteristics due to manufacturing variances. For example, two VCO cores may be mismatched in terms of one or both of capacitance and inductance in their LC tanks. Mismatches between circuit components of the VCO cores cause frequency mismatch or amplitude mismatch, or both, between the (free running/uncoupled) outputs of the VCO cores, leading to stray mismatch currents in between the cores and thus energy loss and phase noise degradation in the multicore VCO. More specifically, capacitance or inductance mismatch cause frequency mismatch. In addition, transistor (i.e. gain element) or resistor mismatches lead to mismatches in the oscillators gain stages and hence the oscillation amplitude. FIG. 10A illustrates a multicore VCO array with matched circuits, and FIG. 10B illustrates a multicore VCO array with mismatched circuits.

Ideally if VCO cores are matched, i.e. frequency and amplitude characteristics of the individual cores are identical, no current flows through the interconnect network connecting the VCO cores in the array. The presence of no current flow is shown in FIG. 10A as I≈0 in an interconnecting link 1010 between VCO cores 1002 and 1004. However, mismatched VCO cores generally cause current to flow through the interconnect network of the array and between the cores. Various possible mismatches in one or more components of the two cores 1002 and 1004 are represented by the $\Delta L$, $\Delta C$, and $\Delta g_m$. The presence of current flowing between cores is shown in FIG. 10B as I≠0 in the interconnecting link 1010 between VCO cores 1002 and 1004. Such stray currents cause power dissipation and degrade collective phase noise of the multicore VCO, which are generally undesirable. For example, current flowing through the interconnect network between cores degrades phase noise because the interconnect between physically large or spaced apart LC VCO structures is resistive. The impedance of the interconnect network and the magnitude of mismatch between VCO cores introduces a practical limit to the multicore VCO array size.

Similarly, the selection circuitry in a multicore VCO may have undesirable (parasitic) resistance. For example, unlike an ideal switch, a real switch has a parasitic resistance. If there is a mismatch between VCO cores, undesired current will flow between the VCO cores across the parasitic resistance of the switches connecting the VCO cores, thus causing energy loss in the oscillations and an increase in oscillation phase noise.

In an embodiment of the present disclosure, a multicore VCO is calibrated to reduce any current flowing in between VCO cores due to mismatches between the cores and the effect of such currents passing through the parasitic resistances of the switches between the cores. In general terms, for calibration in one embodiment, one or both of the amplitude and frequency of the output from a VCO core may be compared to the amplitude and frequency of other cores. Then based on the comparisons, one or both of the amplitude and frequency of one or more of the cores may be adjusted to reduce the mismatch.

Aspects of circuits or methods for controlling mismatch in an oscillator array are described in U.S. Pat. No. 9,356,608, issued May 31, 2016 and entitled "Method and Apparatus for Controlling Mismatch in a Voltage Controlled Oscillator Array", which is incorporated herein by reference.

In an embodiment, as shown in FIG. 2A, one or more of the VCO cores may comprise an individual frequency adjustment input 220(a-d) operatively coupled to an internal independent frequency adjustment, also known as frequency calibration, mechanism (not shown in FIG. 2A). The frequency of the output from a VCO core varies in response to one or more digital or analog control signals at the respective frequency adjustment input 220(a-d), which may be used to reduce, and in some embodiments or instances substantially reduce, frequency mismatches among multiple VCO cores in the VCO array.

Additionally or alternatively, each VCO core may comprise an individual swing adjustment input 222(a-d) operatively coupled to an internal independent swing adjustment, also known as amplitude calibration, mechanism (not shown in FIG. 2A). The amplitude of the output from a VCO core varies in response to one or more digital or analog control signals at the respective swing adjustment input 222(a-d) to reduce, and in some embodiments or instances substantially reduce, amplitude mismatches among multiple VCO cores in the VCO array. In addition, each VCO core may comprise an individual power down input 224(a-d) for selectively powering up and powering down the core.

In an embodiment, one or more of inputs 220(a-d), 222(a-d) or 224(a-d) are individually adjustable for each respective core. The VCO cores in an array that are decoupled from a common signal output circuitry or interconnect network may be powered down to save power and reduce the overall power consumption of the multicore oscillator.

In an embodiment, as shown in FIG. 2B, the outputs of two VCO cores at a time may be connected to one or both of a frequency comparator 260 and a swing comparator 270. The outputs of the VCO cores may be connected to two N:1 multiplexers 275, 276, which are in turn connected to the frequency comparator 260 and the swing comparator 270 for comparing the outputs of two VCO cores at a time.

The frequency comparator 260 generates an output 261 determined by mismatch between the frequencies of the two selected core outputs, and the swing comparator 270 generates an output 271 determined by mismatch between the amplitudes of the two selected core outputs. The outputs 261 and 271 of the frequency and swing comparators 260 and 270, respectively, are provided to a controller 280 for applying suitable signals to the frequency and swing adjustment inputs 220(a-d) and 222(a-d), respectively, to adjust and substantially match the frequency and amplitude of the VCO core oscillations based on the outputs 261 and 271. Output signals from the controller 280 are provided over one or more outputs 281 of the controller 280 to the frequency and swing adjustment inputs 220(a-d) and 222(a-d).

In an embodiment, some or all of the calibration may be performed or controlled by a controller such as controller 1380 in the embodiment of FIG. 13 described below. The controller may be coupled to one or both of the frequency adjustment input 220(a-d) and the swing adjustment input 222(a-d) of each VCO core.

Having well-matched VCO cores reduces unwanted stray mismatch currents. As a result, higher switch parasitic resistances may be tolerated. For example, in a multicore VCO having two VCO cores and operated around an oscillation frequency of 10 GHz and a capacitance mismatch of 10%, a parasitic resistance of switches and conductive interconnects between cores of 20Ω causes a phase noise degradation of only 0.2 decibels (dB) or less. However, if the switch resistance is increased to 100Ω, the phase noise degradation increases to about 1 dB, which is no longer negligible. If the switch resistance is too high, at some point there is not enough coupling between the two mismatched VCO cores and the two cores oscillate independently at their own resonance frequencies. On the other hand, in a multicore VCO having two VCO cores and operated around an oscillation frequency of 10 GHz and a capacitance mismatch of 2%, switches and conductive interconnects can have a parasitic resistance as high as 100 ohms and produce the same phase noise degradation of only 0.2 decibels (dB) or less.

Accordingly, the better the matching between VCO cores, the more parasitic resistance in the switches of the selection circuitry of the multicore VCO can be tolerated. Put another way, the impact of the resistance of non-ideal switches (e.g. CMOS transmission gates) on the phase noise of the multicore VCO diminishes as the matching between cores increases using mismatch removal calibration. Therefore, calibration to mitigate the mismatch effects may allow for a fairly relaxed resistance requirement (e.g. as high as 100Ω) for analog switches in the selection circuitry of a multicore VCO.

Depending on a required phase noise performance for a given implementation, a certain level of mismatch may be tolerated. If the mismatch between the cores is above this tolerable level, calibration will help to remove or mitigate the mismatch. For example, in an embodiment, the tolerable mismatch between frequency and/or amplitude values of VCO cores is 2% or less. In another embodiment, the tolerable mismatch between frequency and/or amplitude values between VCO cores is 1% or less. It is to be appreciated that these toleration values are only examples and are thus not meant to be limiting in any way.

Furthermore, in some embodiments, the enabled VCO cores are substantially matched to each other in one or both of oscillation amplitude and resonance frequency.

Figure 11:
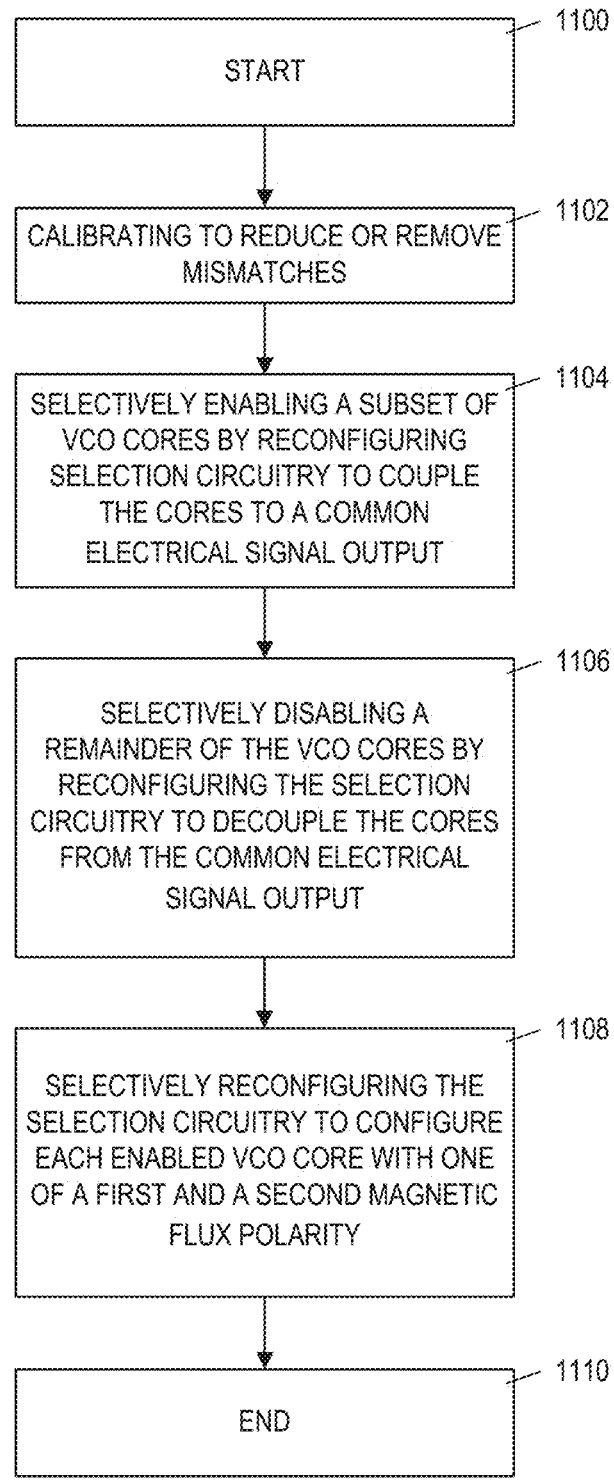
FIG. 11 is a process flow chart of a process for configuring a multicore VCO in an embodiment.

FIG. 11 shows a process for reconfiguring a multicore VCO in an embodiment according to the present disclosure. In particular, the process is for reconfiguring a multicore LC VCO comprising a plurality of VCO cores arranged in an array and each having an LC resonance tank.

The process starts at block 1100 and proceeds to block 1102, where calibration may be performed to reduce or remove mismatches between VCO cores. A goal of this calibration is to match standalone oscillation frequencies and oscillation amplitudes of individual VCO cores participating in the enabled subset in the multicore array. To perform matching calibration, two VCO cores are enabled standalone (i.e. not coupled) at each time and their frequency and amplitude are adjusted and compared until matching is achieved. The adjustment and comparing was described above with reference to FIGS. 10A and 10B. The process may then be repeated on the other VCO cores until all cores to be used in the multicore configuration are matched. By matching the oscillation characteristics of the VCO cores, any mismatch-induced current in between the VCO cores in the final multicore configuration will be reduced, which may in turn reduce energy losses and phase noise degradation. The calibrating in block 1102 is optional and thus is not necessarily performed in all embodiments. Some embodiments may not have the calibrating if the matching is sufficient or the phase noise degradation can be tolerated.

The process then proceeds to block 1104, where a subset of the plurality of VCO cores are selectively enabled by reconfiguring selection circuitry to cause the subset of VCO cores to be electrically coupled to a common electrical signal output of the multicore VCO.

The process then proceeds to block 1106, where a remainder of the VCO cores is selectively disabled by reconfiguring the selection circuitry to cause the remainder of VCO cores to be electrically decoupled from the common electrical signal output so that the subset is enabled and the remainder is disabled simultaneously. The remainder of VCO cores is not in the subset of enabled VCO cores, and each of the subset and the remainder include at least one VCO core.

The process then proceeds to block 1108, where the selection circuitry is selectively reconfigured to configure each VCO core of the enabled subset of VCO cores with one of a first magnetic flux polarity and a second magnetic flux polarity opposite to the first magnetic flux polarity.

The selective reconfiguring of the VCO allows for adjustment of one or more properties or characteristics of the multicore VCO. As previously described, the properties may include but are not limited to one or more of a collective phase noise characteristic at the common electrical signal output, a collective electromagnetic interference characteristic of the multicore VCO, and the collective power consumption of the multicore VCO.

The process then proceeds to block 1110 and ends.

Figure 12:
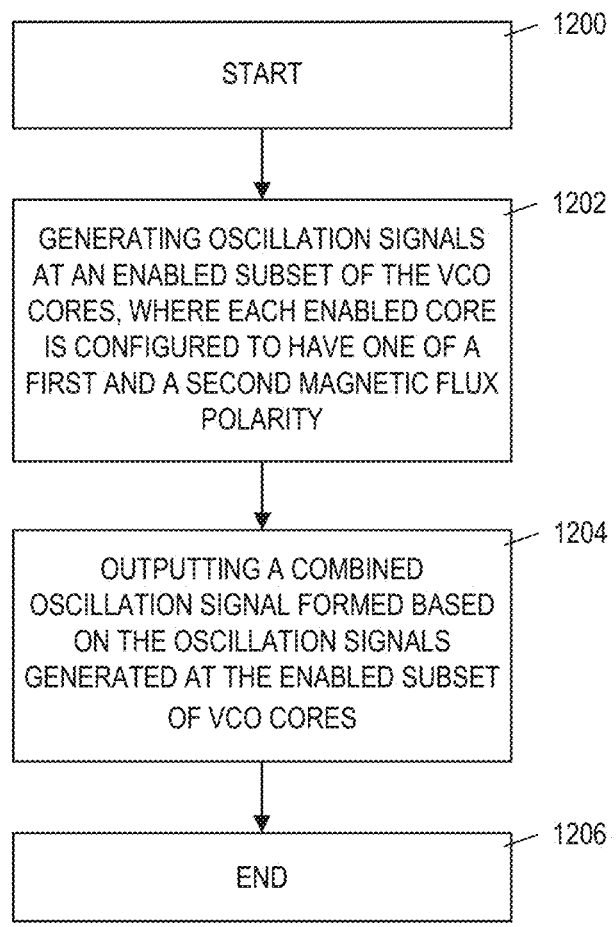
FIG. 12 is a process flow chart of a process related to operating a multicore VCO in an embodiment.

FIG. 12 shows a process related to operating a multicore VCO comprising a plurality of VCO cores arranged in an array and each having an LC resonance tank. The process starts at block 1200. In some embodiments, the multicore VCO may be reconfigured (not shown). The reconfiguring may include but is not limited to some or all of the configuring and calibrating described and shown in FIG. 11. The process then proceeds to block 1202, where oscillation signals are generated at an enabled subset of the plurality of VCO cores. Each VCO core of the enabled subset is configured to have one of a first magnetic flux polarity and a second magnetic flux polarity opposite to the first magnetic flux polarity. A remainder of the plurality of VCO cores is disabled. The remainder of the VCO cores is not in the enabled subset. Furthermore, each of the subset and the remainder of VCO cores include at least one VCO core.

The process then proceeds to block 1204, where a combined oscillation signal is outputted, where the combined oscillation signal is formed based on the oscillation signals generated at the enabled subset of VCO cores. The number of VCO cores in the enabled subset generally affects the overall power consumption of the multicore VCO since more enabled cores typically consume more power than fewer enabled cores.

One or more properties of the combined oscillation signal may be based on the number of VCO cores in the enabled subset or the magnetic flux polarities of the enabled VCO cores. The properties may include but are not limited to a collective phase noise characteristic in the outputted combined oscillation signal. Additionally or alternatively, the properties may include an overall power consumption of the multicore VCO. Additionally or alternatively, one or more properties or characteristics of the multicore VCO may be based on the configuration of the enabled VCO cores, such as for example a collective electromagnetic interference characteristic of the multicore VCO.

The process then proceeds to block 1206 and ends.

Figure 13:
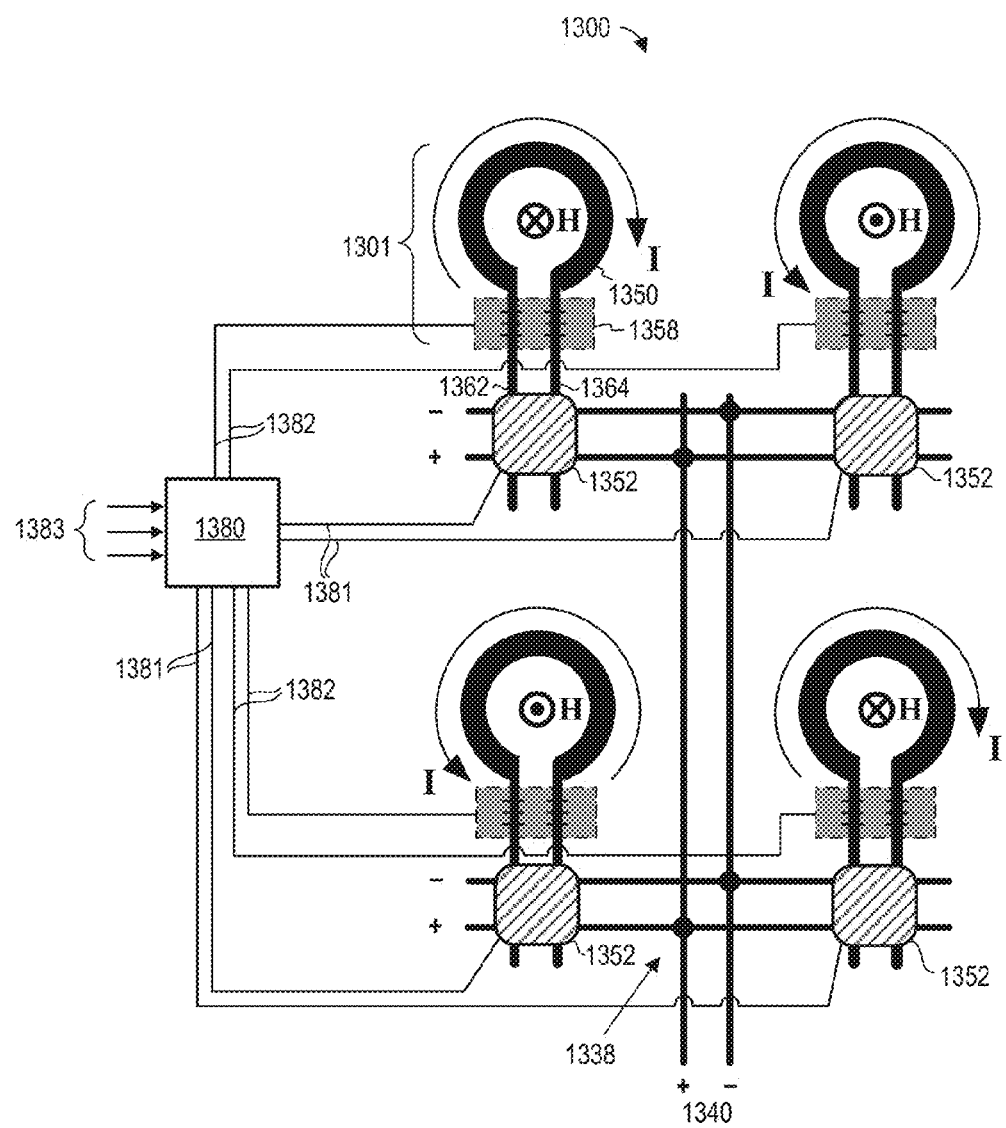
FIG. 13 is a diagram of a multicore VCO comprising a controller in an embodiment.

FIG. 13 shows a multicore VCO 1300 according to an embodiment of the present disclosure wherein the VCO comprises a controller 1380 for one or more of controlling, configuring, reconfiguring and operating the VCO. Controller 1380 is in communication with the selection circuitry of the VCO 1300 via control lines 1381. In this embodiment, the selection circuitry of the VCO comprises selection circuitry 1352 associated with each core 1301. Selection circuitry 1352 for each core is represented with a generic box with hatching. Selection circuitry 1352 is reconfigurable to electrically couple first and second terminals 1362 and 1364 to positive (+) and negative (−) conductive links of interconnect network 1338 in one of at least two configurations. In one configuration, selection circuitry 1352 electrically couples first and second terminals 1362 and 1364 to positive (+) and negative (−) conductive links, respectively. In another configuration, selection circuitry 1352 electrically couples first and second terminals 1362 and 1364 in an opposite manner, namely to negative (−) and positive (+) conductive links, respectively. In addition, the multicore VCO 1300 further comprises a common electrical signal output 1340 electrically coupled to or forming part of an interconnect network 1338.

Controller 1380 is configured to control the selection circuitry for coupling and or decoupling the VCO cores to the interconnect network 1338 of the VCO, and thus to the common electrical signal output. Additionally or alternatively, controller 1380 is adapted to configure the VCO cores with one of the first and second magnetic flux polarities. Furthermore, additionally or alternatively, controller 1380 is adapted to configure the number of the plurality of VCO cores in the array that are powered up and powered down, or which particular VCO cores are powered up and powered down.

In an embodiment, controller 1380 is configured to receive configuration information and to control the selection circuitry based on the configuration information. The configuration information may originate externally of the multicore VCO and may comprise any type of useful or suitable configuration or control information. For example, the configuration information received at controller 1380 may originate from an external computing device. The external computing device may receive or otherwise obtain the configuration information over a communications link, from a computer readable storage medium, through a user interface, or in any other suitable fashion. A plurality of inputs 1383 to controller 1380 over which configuration information or other information may be received is shown in FIG. 13, but it is to be appreciated that these are only examples. In an embodiment, received information may include matching calibration information, for example outputs from a frequency comparator or swing comparator such as those shown in FIG. 2B. Furthermore, configuration information may include but is not limited to how many cores to enable and disable, which particular cores to enable and disable, the direction in which the oscillation current is to flow in the cores, how many or which particular cores to power up and power down, without limitation. Additionally or alternatively, configuration information may include an indication for configuring one or both of a collective phase noise characteristic at the signal output circuitry, and a collective electromagnetic interference characteristic of the multicore VCO. An indication may signal that a particular number or percentage of VCO cores are to be enabled, that the VCO cores are to be configured so that the oscillation current flows in the same direction in every enabled core (e.g. the cores all have the same magnetic flux polarity), that the VCO cores are to be configured so that the oscillation current flows in different directions in different enabled cores, the locations of the enabled VCO cores within the array, whether the enabled VCO cores are to be concentrated together or spread apart, without limitation.

Controller 1380 generally comprises an electronic processor for executing instructions to control or configure the selection circuitry, and may also comprise an input/output interface for interfacing with one or both of the selection circuitry of the VCO or with external components or systems such as a computing device. Controller 1380 may further comprise a memory storing computer readable instructions for operation of controller 1380.

Furthermore, controller 1380 may be in communication with other parts or circuitry of each VCO core 1301, such as core circuitry 1358, for example for providing a control voltage to the multicore VCO, for adjusting one or both of the oscillation frequency or oscillation phase of the multicore VCO to reduce mismatches, without limitation. In the embodiment of FIG. 13, controller 1380 is shown in communication with core circuitry 1358 of the cores via control lines 1382.

A multicore VCO may be configured to provide desirable performance characteristics, which typically depend on the application in which the multicore VCO is to be used. In an embodiment, the multicore VCO may be configured in an open loop system where desired parameters are determined and the VCO is configured accordingly without any further changes or reconfigurations. The parameters and configuration may be determined beforehand in simulation or in any other suitable way.

In another embodiment, the multicore VCO may be configured in a closed loop system where one or more parameters are sensed and the configuration of the VCO is adjusted based on sensing. In an embodiment, the EMI of the VCO may be sensed and the configuration of the VCO may be changed automatically in response to sensed EMI being above or below a defined threshold. In some embodiments, the automatic reconfiguration of the multicore VCO may be based on one or more other sensed parameters such as overall phase noise or jitter of the VCO output or the power dissipation of the VCO, without limitation, and one or more of the parameters being above or below a defined threshold. Such embodiments may comprise hardware for performing the sensing. The reconfiguration may be handled by a controller, such as controller 1380 in the embodiment of FIG. 13.

Figure 14:
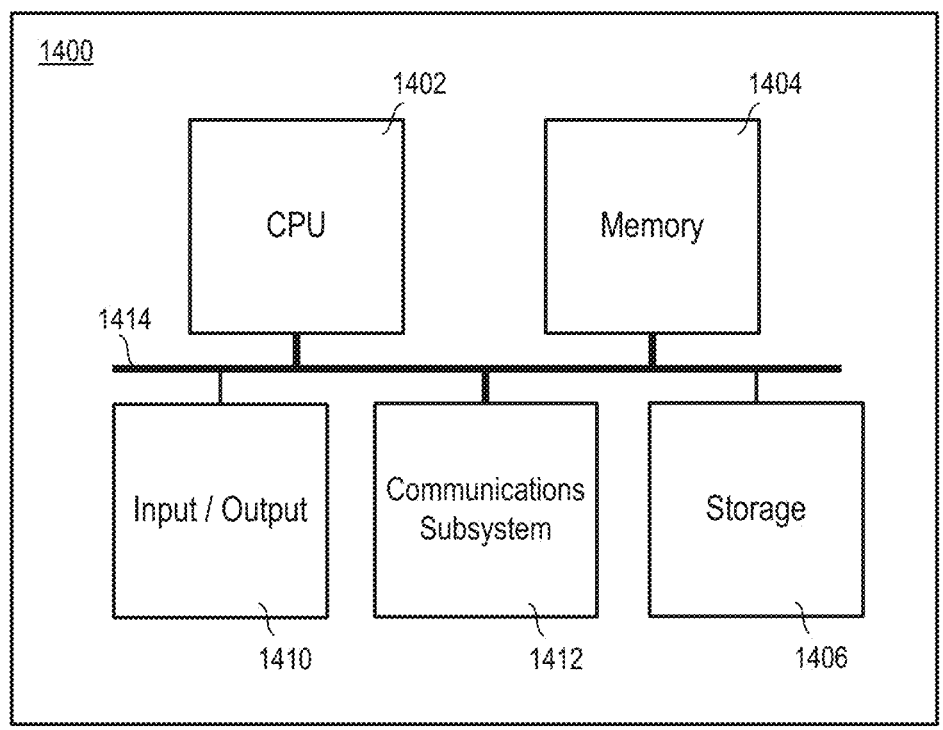
FIG. 14 is a block diagram of an example electronic device that may be used in implementing one or more aspects or components of an embodiment.

FIG. 14 is a block diagram of an example electronic device 1400 that may be used in implementing one or more aspects or components of an embodiment according to the present disclosure, including but not limited to controller 1380 in the embodiment of FIG. 13.

The electronic device 1400 may include one or more of a central processing unit (CPU) 1402, memory 1404, a mass storage device 1406, an input/output (I/O) interface 1410, and a communications subsystem 1412. One or more of the components or subsystems of electronic device 1400 may be interconnected by way of one or more buses 1414 or in any other suitable manner.

The bus 1414 may be one or more of any type of several bus architectures including a memory bus, storage bus, memory controller bus, peripheral bus, or the like. The CPU 1402 may comprise any type of electronic data processor, including without limitation an FPGA, a microprocessor and a microcontroller. A state machine may be substituted for CPU 1402 without exceeding the scope. The memory 1404 may comprise any type of system memory such as dynamic random access memory (DRAM), static random access memory (SRAM), synchronous DRAM (SDRAM), read-only memory (ROM), a combination thereof, or the like. In an embodiment, the memory may include ROM for use at boot-up, and DRAM for program and data storage for use while executing programs.

The mass storage device 1406 may comprise any type of storage device configured to store data, programs, and other information and to make the data, programs, and other information accessible via the bus 1414. The mass storage device 1406 may comprise one or more of a solid state drive (SSD), hard disk drive (HDD), a magnetic disk drive, an optical disk drive, or the like. In some embodiments, data, programs, or other information may be stored remotely, for example in the "cloud". Electronic device 1400 may send or receive information to the remote storage in any suitable way, including via communications subsystem 1412 over a network or other data communication medium.

The I/O interface 1410 may provide interfaces to couple one or more other devices (not shown) to the electronic device 1400. The other devices may include but are not limited to one or more of a multicore VCO, individual VCO cores of a multicore VCO, selection circuitry in a multicore VCO, without limitation. Furthermore, additional or fewer interfaces may be utilized. For example, one or more serial interfaces such as Universal Serial Bus (USB) (not shown) may be provided.

A communications subsystem 1412 may be provided for one or both of transmitting and receiving signals. Communications subsystems may include any component or collection of components for enabling communications over one or more wired and wireless interfaces. These interfaces may include but are not limited to USB, Ethernet, high-definition multimedia interface (HDMI), Firewire (e.g. IEEE 1394), Thunderbolt™, WiFi™ (e.g. IEEE 802.11), WMAX (e.g. IEEE 802.16), Bluetooth™, or Near-field communications (NFC), as well as GPRS, UMTS, LTE, LTE-A, dedicated short range communication (DSRC), and IEEE 802.11. Communication subsystem 1412 may include one or more ports or other components for one or more wired connections (not shown). Additionally or alternatively, communication subsystem 1412 may include one or more transmitters, receivers, and/or antenna elements (not shown).

The electronic device 1400 of FIG. 14 is merely an example and is not meant to be limiting. Various embodiments may utilize some or all of the components shown or described. Some embodiments may use other components not shown or described but known to persons skilled in the art.

Furthermore, although the embodiments described herein comprise voltage controlled oscillators, it is to be appreciated that the teachings of the present disclosure may also be applied to other types of oscillators, including but not limited to current-controlled oscillators and electromechanical oscillators.

As used herein, the terms "connected", "connection", and "coupled" generally mean that the referred to elements are electrically connected, whether directly or indirectly, such that an electrical current may flow from one to the other, unless indicated otherwise. The connection may include a direct conductive connection, an inductive connection, a capacitive connection, a resistive connection, and/or any other suitable combination thereof to make electrical connection. Intervening components may be present.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments or parts thereof according to the present disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The structure, features, accessories, and alternatives of specific embodiments described herein and shown in the Figures are intended to apply generally to all of the teachings of the present disclosure, including to all of the embodiments described and illustrated herein, insofar as they are compatible.

In addition, the steps and the ordering of the steps of methods described herein are not meant to be limiting. Methods comprising different steps, different number of steps, and/or different ordering of steps are also contemplated.

The above-described embodiments are intended to be examples only. Alterations, modifications and variations can be effected to the particular embodiments by those of skill in the art without departing from the scope, which is defined solely by the claims appended hereto.

What is claimed is:

1. A method for reconfiguring a multicore inductor-capacitor (LC) oscillator where selective configuring of the oscillator cores allows for adjustment of at least one of a collective phase noise characteristic at a common electrical signal output or a collective electromagnetic interference characteristic of the multicore oscillator, the method comprising:
configuring the multicore LC oscillator comprising a plurality of oscillator cores arranged in an array and each having an LC resonance tank by:
selectively enabling a subset of the plurality of oscillator cores by configuring selection circuitry to cause the subset of oscillator cores to be electrically coupled to the common electrical signal output of the multicore oscillator;
selectively disabling a remainder of the oscillator cores by configuring the selection circuitry to cause the remainder of oscillator cores to be electrically decoupled from the common electrical signal output so that the subset is enabled and the remainder is disabled simultaneously, the remainder not in the subset and each of the subset and the remainder including at least one oscillator core; and
selectively configuring the selection circuitry to configure each oscillator core of the enabled subset of oscillator cores with one of a first magnetic flux polarity and a second magnetic flux polarity opposite to the first magnetic flux polarity,
where the enabling, disabling, and configuring the magnetic flux polarities of the plurality of cores is reconfigurable.

2. The method of claim 1, wherein the configuring of the multicore oscillator further comprises adjusting one or more of the plurality of oscillator cores so that the plurality of oscillator cores are substantially matched to each other in oscillation amplitude and resonance frequency.

3. The method of claim 1, wherein the configuring the selection circuitry comprises configuring the plurality of oscillator cores such that there are no disabled oscillator cores between any two enabled oscillator cores in the array.

4. The method of claim 1, wherein the configuring the selection circuitry comprises configuring the plurality of oscillator cores such that there is at least one disabled oscillator core between two enabled oscillator cores in the array.

5. The method of claim 1, further comprising:
configuring the selection circuitry such that some of the enabled oscillator cores have the first magnetic flux polarity and the rest of the enabled oscillator cores have the second magnetic flux polarity for reducing the overall electromagnetic interference of the multicore oscillator.

6. The method of claim 1, wherein the configuring the selection circuitry comprises configuring analog switches for each enabled oscillator core to connect the oscillator core to the common electrical signal output in one of a first configuration where oscillation current flows through an inductor of its LC resonance tank in a first direction resulting in the first magnetic flux polarity, and a second configuration where oscillation current flows through the inductor of its LC resonance tank in a second direction opposite to the first direction resulting in the second magnetic flux polarity.

7. The method of claim 1, further comprising:
configuring the selection circuitry such that all of the enabled oscillator cores have the same magnetic flux polarity for reducing the overall phase noise of the multicore oscillator at the common electrical signal output.

8. The method of claim 1, further comprising:
receiving configuration parameters for configuring the multicore oscillator, and the selectively configuring the multicore oscillator being based on the received configuration parameters.

9. A method for operating a multicore inductor-capacitor (LC) oscillator where generating oscillation signals at an enabled subset of cores allows for adjustment of at least one of a collective phase noise characteristic in an outputted combined oscillation signal or an overall power consumption of the multicore oscillator, the method comprising:
operating the multicore LC oscillator comprising a plurality of oscillator cores arranged in an array and each having an LC resonance tank by:
generating oscillation signals at an enabled subset of the plurality of oscillator cores, where each oscillator core of the enabled subset is configured to have one of a first magnetic flux polarity and a second magnetic flux polarity opposite to the first magnetic flux polarity, and where a remainder of the plurality of oscillator cores is disabled and powered down, the remainder not being in the enabled subset and each of the subset and the remainder including at least one oscillator core, and where the enabling and disabling of the plurality of cores is reconfigurable; and
outputting a combined oscillation signal formed based on the oscillation signals generated at the enabled subset of oscillator cores.

10. The method of claim 9, further comprising adjusting one or more of the plurality of oscillator cores so that the plurality of oscillator cores are substantially matched to each other in oscillation amplitude and resonance frequency.

11. The method of claim 9, further comprising configuring the plurality of oscillator cores such that there are no disabled oscillator cores between any two enabled oscillator cores in the array.

12. The method of claim 9, further comprising configuring the plurality of oscillator cores such that there is at least one disabled oscillator core between two enabled oscillator cores in the array.

13. The method of claim 9, wherein the number of disabled and powered down cores in the remainder is at least 50% of the plurality of cores of the oscillator.

14. An apparatus providing for the selective reconfiguring of oscillator cores of a multicore oscillator to provide adjustment of at least one of a collective phase noise characteristic at a signal output circuitry or of a collective electromagnetic interference characteristic of the multicore oscillator, the apparatus comprising:
a multicore inductor-capacitor (LC) oscillator having a plurality of oscillator cores arranged in an array and each having an LC resonance tank;
signal output circuitry for electrically coupling outputs of the plurality of cores and for outputting a combined oscillation signal formed based on oscillation signals generated at a subset of the plurality of oscillator cores; and reconfigurable selection circuitry for selectively coupling the subset of the plurality of oscillator cores to the signal output circuitry for enabling the subset, and for selectively decoupling a remainder of the plurality of oscillator cores from the signal output circuitry for disabling the remainder, where the remainder is not in the subset and each of the subset and the remainder includes at least one oscillator core,
the selection circuitry also for selectively configuring each oscillator core of the enabled subset of oscillator cores to have one of a first magnetic flux polarity and a second magnetic flux polarity opposite to the first magnetic flux polarity.

15. The apparatus of claim 14, wherein the selection circuitry comprises a plurality of reconfigurable analog switches, where one or more of the analog switches of the plurality are electrically disposed between each oscillator core and the signal output circuitry for the selectively coupling or decoupling the oscillator core to the signal output circuitry and for the configuring the oscillator core with one of the first and second magnetic flux polarities.

16. The apparatus of claim 14, further comprising:
a controller in communication with the selection circuitry, the controller configured to:
receive configuration information; and
control the selection circuitry based on the configuration information for coupling or decoupling the oscillator cores to the signal output circuitry and for configuring oscillator cores with one of the first and second magnetic flux polarities.

17. The apparatus of claim 16, wherein the received configuration information includes an indication for configuring at least one of a collective phase noise characteristic at the signal output circuitry or a collective electromagnetic interference characteristic of the multicore oscillator, and the controller is configured to control the selection circuitry based on the indication.

18. The apparatus of claim 14, wherein the selection circuitry configures the plurality of oscillator cores such that there are no disabled oscillator cores between any two enabled oscillator cores in the array.

19. The apparatus of claim 14, wherein the selection circuitry configures the plurality of oscillator cores such that there is at least one disabled oscillator core between two enabled oscillator cores in the array.

20. The apparatus of claim 14, wherein the selection circuitry configures some of the enabled oscillator cores with the first magnetic flux polarity and the rest of the enabled oscillator cores with the second magnetic flux polarity for reducing the overall electromagnetic interference of the multicore oscillator.

21. The apparatus of claim 14, wherein the selection circuitry comprises analog switches for each enabled oscillator core for connecting the oscillator core to the signal output circuitry in one of a first configuration where oscillation current flows through an inductor of its LC resonance tank in a first direction resulting in the first magnetic flux polarity, and a second configuration where oscillation current flows through the inductor of its LC resonance tank in a second direction opposite to the first direction resulting in the second magnetic flux polarity.

22. The apparatus of claim 14, wherein the selection circuitry is configured to provide all of the enabled oscillator cores with the same magnetic flux polarity for reducing the overall phase noise of the multicore oscillator at the signal output circuitry.

23. The apparatus of claim 14, further configured to adjust one or more of the plurality of oscillator cores so that the plurality of oscillator cores are substantially matched to each other in oscillation amplitude and resonance frequency.

24. The apparatus of claim 14, wherein there is at least one disabled oscillator core located physically closer to a victim circuitry located outside of the array of oscillator cores compared to all of the oscillator cores in the enabled subset for reducing the electromagnetic interference of the enabled subset at the victim circuitry.

25. The apparatus of claim 14, configured to power down the disabled remainder of the plurality of oscillator cores.

* * * * *